United States Patent
Tominaga

(10) Patent No.: US 10,871,691 B2
(45) Date of Patent: Dec. 22, 2020

(54) DISPLAY DEVICE

(71) Applicant: Sharp Kabushiki Kaisha, Sakai (JP)

(72) Inventor: Masakatsu Tominaga, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/585,257

(22) Filed: Sep. 27, 2019

(65) Prior Publication Data

US 2020/0110320 A1    Apr. 9, 2020

Related U.S. Application Data

(60) Provisional application No. 62/743,255, filed on Oct. 9, 2018.

(51) Int. Cl.
| | | |
|---|---|---|
| H01L 23/52 | (2006.01) | |
| G02F 1/1362 | (2006.01) | |
| H01L 27/12 | (2006.01) | |
| G02F 1/1343 | (2006.01) | |
| G02F 1/1368 | (2006.01) | |

(52) U.S. Cl.
CPC ...... *G02F 1/136286* (2013.01); *H01L 27/124* (2013.01); *G02F 1/1368* (2013.01); *G02F 1/134363* (2013.01); *G02F 2001/13629* (2013.01); *G02F 2201/123* (2013.01)

(58) Field of Classification Search
CPC .......................... H01L 27/124; G02F 1/136286
USPC .......................................................... 257/773
See application file for complete search history.

(56) References Cited

U.S. PATENT DOCUMENTS

2016/0299399 A1* 10/2016 Kitani ............... G02F 1/136286

FOREIGN PATENT DOCUMENTS

| | | |
|---|---|---|
| JP | 5-224239 A | 9/1993 |
| JP | 10-10571 A | 1/1998 |
| JP | 10-253987 A | 9/1998 |

* cited by examiner

*Primary Examiner* — Luan C Thai
(74) *Attorney, Agent, or Firm* — Keating & Bennett, LLP

(57) ABSTRACT

A display device includes a substrate including pixel electrodes, a first data line extending in the first direction and through which a data signal is supplied to the pixel electrodes in a first region that is close to one ends of the pixel electrodes in the first direction, and a second data line extending in the first direction and through which a data signal is supplied to the pixel electrodes in a second region that is closer to another ends of the pixel electrodes in the first direction than the first region is, and a driver circuit disposed close to the one ends of the pixel electrodes and configured to supply a data signal to each of the pixel electrodes through the first data line and the second data line. The first data line and the second data line are overlapped with each other in the first region.

10 Claims, 20 Drawing Sheets

FIG.8A
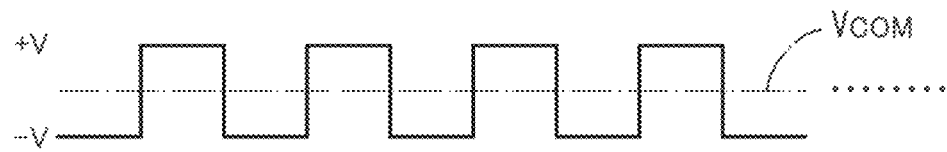
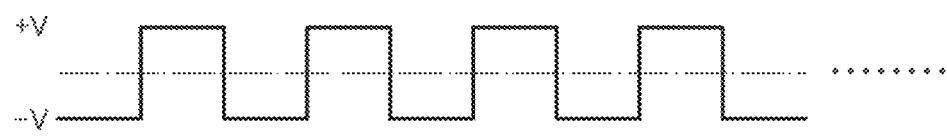
FIG.8B
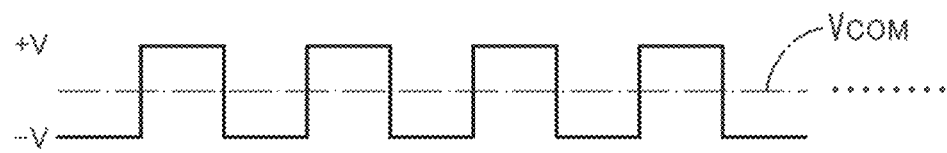
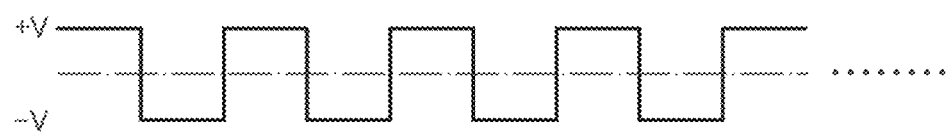
FIG.8C
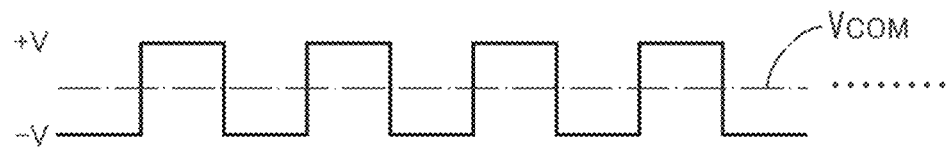
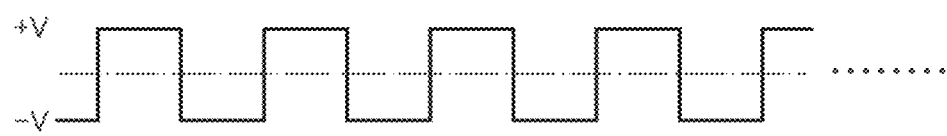

DISPLAY DEVICE

CROSS REFERENCE TO RELATED APPLICATION

This application claims priority from U.S. Provisional Patent Application No. 62/743,255 filed on Oct. 9, 2018. The entire contents of the priority application are incorporated herein by reference.

TECHNICAL FIELD

The technology described herein relates to a display device.

BACKGROUND ART

As a definition and a refresh rate (vertical synchronization frequency) of a display device such as a liquid crystal display device, an organic electroluminescent (EL) display device, or the like have become higher, a charge time for each pixel has been decreased, which has conventionally been problematic. A first display device described in Japanese Unexamined Patent Application Publication No. H05-224239 has a configuration in which a driver circuit is provided at each of opposite ends of the display device in a first direction (vertical direction) in which a plurality of pixel electrodes are arranged to drive a lower region and an upper region independently of each other. A second display device described in Japanese Unexamined Patent Application Publication No. H10-10571 is a liquid crystal display device including a pair of substrates, and has a configuration in which each of the pair of substrates includes a pixel electrode and a facing electrode. A pixel electrode of one of the pair of substrates is disposed so as to overlap with a facing electrode of the other one of the pair of substrates, and the facing electrode of the other one of the pair of substrates is disposed so as to overlap with the pixel electrode of the one of the pair of substrates. A third display device described in Japanese Unexamined Patent Application Publication No. H10-253987 has a configuration in which a plurality of pixel electrodes in a row are divided into two parts, and data lines are provided at the left part and the right part of the row, respectively, thereby making it possible to supply a data signal to two pixel electrodes at the same time.

However, in a case of the first display device, it is required to provide the driver circuits on both of the upper portion and the lower portion of the display device in the vertical direction, and thus it is difficult to narrow a width of a frame of the display device. In a case of the second display device, patterning needs to be performed on both of the pair of substrates and the number of stacked films is also increased. Further, a wiring structure for transmission and reception of a signal between one of the pair of substrates and the other one of the substrates is also required. In other words, the second display device has a complicated structure and a producing process thereof thus becomes long, which is problematic. In a case of the third display device, since it is required to provide two data lines between columns of the pixel electrodes, an opening ratio (a ratio of an area of a portion where light passes to an area of one pixel) is decreased and it is apprehended that leakage may be caused between adjacent data lines by the remaining photoresist.

SUMMARY

The technology described herein has been made in view of such a circumstance and an object of the technology described herein is to provide a display device configured to implement a narrow frame width and a high definition without decreasing an opening ratio, and to secure a charge time for each pixel or implement a high refresh rate.

A display device according to the present technology includes a substrate that includes pixel electrodes arranged in a matrix form in a first direction and a second direction intersecting with each other, a first data line extending in the first direction and through which a data signal is supplied to the pixel electrodes disposed in a first region among the pixel electrodes, and the first region being a region close to one ends of the pixel electrodes in the first direction, and a second data line extending in the first direction and through which a data signal is supplied to the pixel electrodes disposed in a second region among the pixel electrodes, and the second region being a region closer to another ends of the pixel electrodes in the first direction than the first region is; and a driver circuit disposed close to the one ends of the pixel electrodes in the first direction and configured to supply a data signal to each of the pixel electrodes through the first data line and the second data line. The first data line and the second data line are disposed so as to overlap with each other in the first region.

According to the technology described herein, it is possible to provide the display device configured to implement a narrow frame width and a high definition without decreasing an opening ratio, and to secure a charge time for each pixel or implement a high refresh rate.

BRIEF DESCRIPTION OF THE DRAWINGS

FIG. 8A is a diagram illustrating an example of data signals input to a first source line and a second source line, respectively, in the liquid crystal display device according to the first embodiment.

FIG. 8B is a diagram illustrating a comparative example of data signals input to the first source line and the second source line, respectively.

FIG. 8C is a diagram illustrating another comparative example of data signals input to the first source line and the second source line, respectively.

DETAILED DESCRIPTION

Hereinafter, as a mode for carrying out the present technology, some embodiments will be described in detail with reference to the drawings. Note that the present technology is not limited to the following embodiments, and can be implemented in variously changed and improved modes based on the knowledge of those skilled in the art.

First Embodiment

Figure 1:
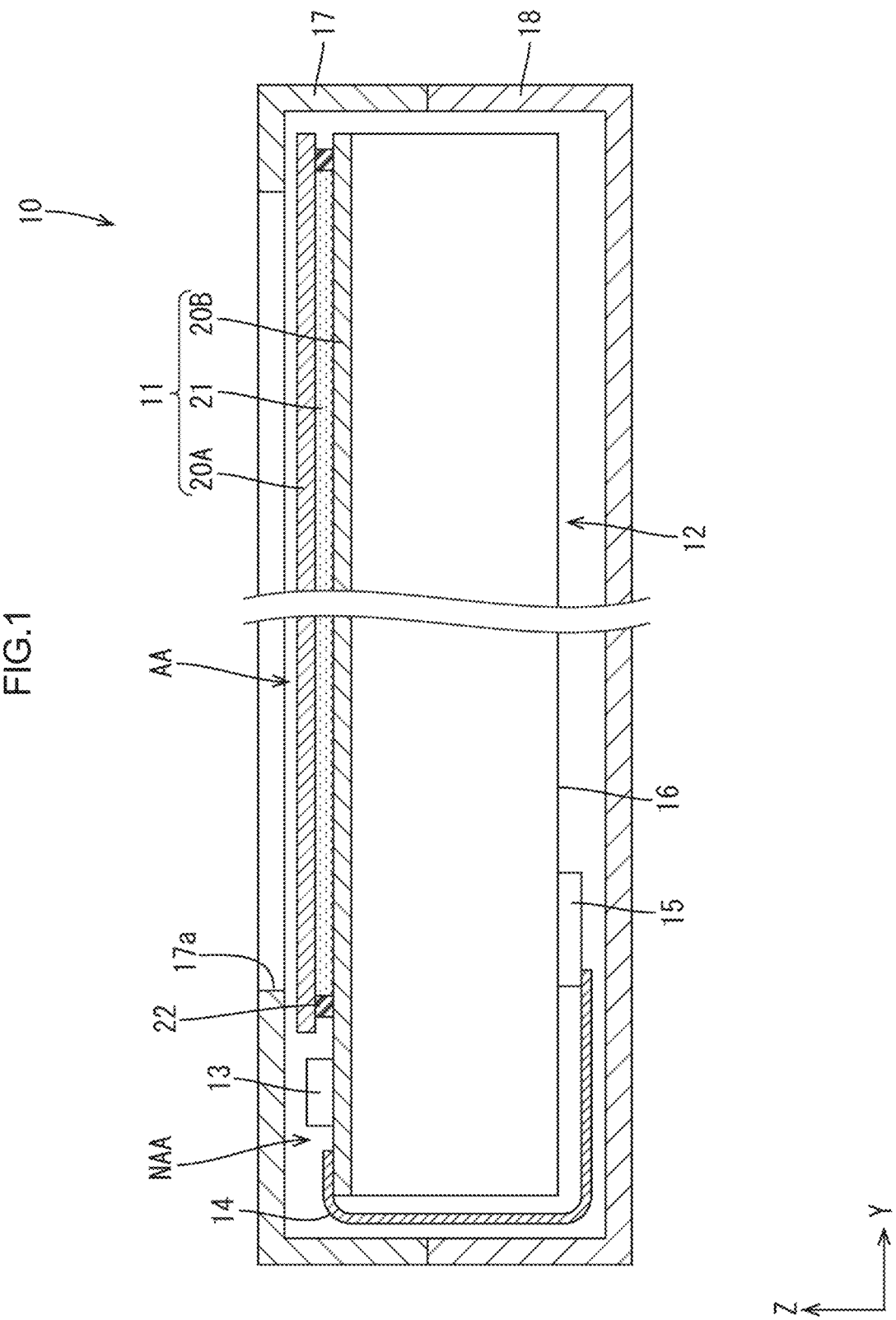
FIG. 1 is a side cross-sectional view of a liquid crystal display device according to a first embodiment.

A liquid crystal display device 10 which is a display device according to a first embodiment is illustrated in FIGS. 1 to 5. The liquid crystal display device 10 mainly includes a liquid crystal panel 11, and a backlight device 12 which supplies light to the liquid crystal panel 11 as illustrated in FIG. 1. Further, a source driver 13 as a driver circuit which drives the liquid crystal panel 11, and a flexible substrate 14 having one end connected to the liquid crystal panel 11 are mounted on the liquid crystal panel 11. The source driver 13 and the flexible substrate 14 are mounted on the liquid crystal panel 11 while having an anisotropic conductive film (ACF) interposed between the source driver 13 and the flexible substrate 14. A control circuit board 15, which is a signal supply source supplying various types of input signal from the outside, is connected to an end of the flexible substrate 14, the end being opposite to an end close to the liquid crystal panel 11. As illustrated in FIG. 1, the backlight device 12 includes a box-shaped chassis 16 opened toward a front side (a side close to the liquid crystal panel 11), a light source (for example, a cold cathode tube, a light emitting diode (LED), an organic electroluminescent (EL) element, or the like) disposed in the chassis 16, an optical sheet disposed so as to cover an opening portion of the chassis 16, and the like.

Further, the liquid crystal display device 10 includes a pair of front and back exterior members 17 and 18 accommodating the liquid crystal panel 11 and the backlight device 12, and an opening portion 17a for allowing an image displayed on a display region AA of the liquid crystal panel to be viewed from the outside is formed in the front exterior member 17. The liquid crystal display device 10 according to the present embodiment is used for various electronic devices such as a liquid crystal television, a mobile phone (including a smartphone and the like), a notebook computer (including a tablet personal computer and the like), a wearable terminal (including a smartwatch and the like), a mobile information terminal (including an electronic book, a personal digital assistant (PDA), and the like), a mobile game machine, and a digital photo frame. Note that an X axis (horizontal direction), a Y axis (vertical direction), and a Z axis (front-back direction) are illustrated in part of each drawing, and a direction of each axis corresponds to a direction described in each drawing. Further, the upper side of FIG. 1 in the Z axis direction is also referred to as a front side and the lower side of FIG. 1 in the Z axis direction is also referred to as a back side.

Figure 2:
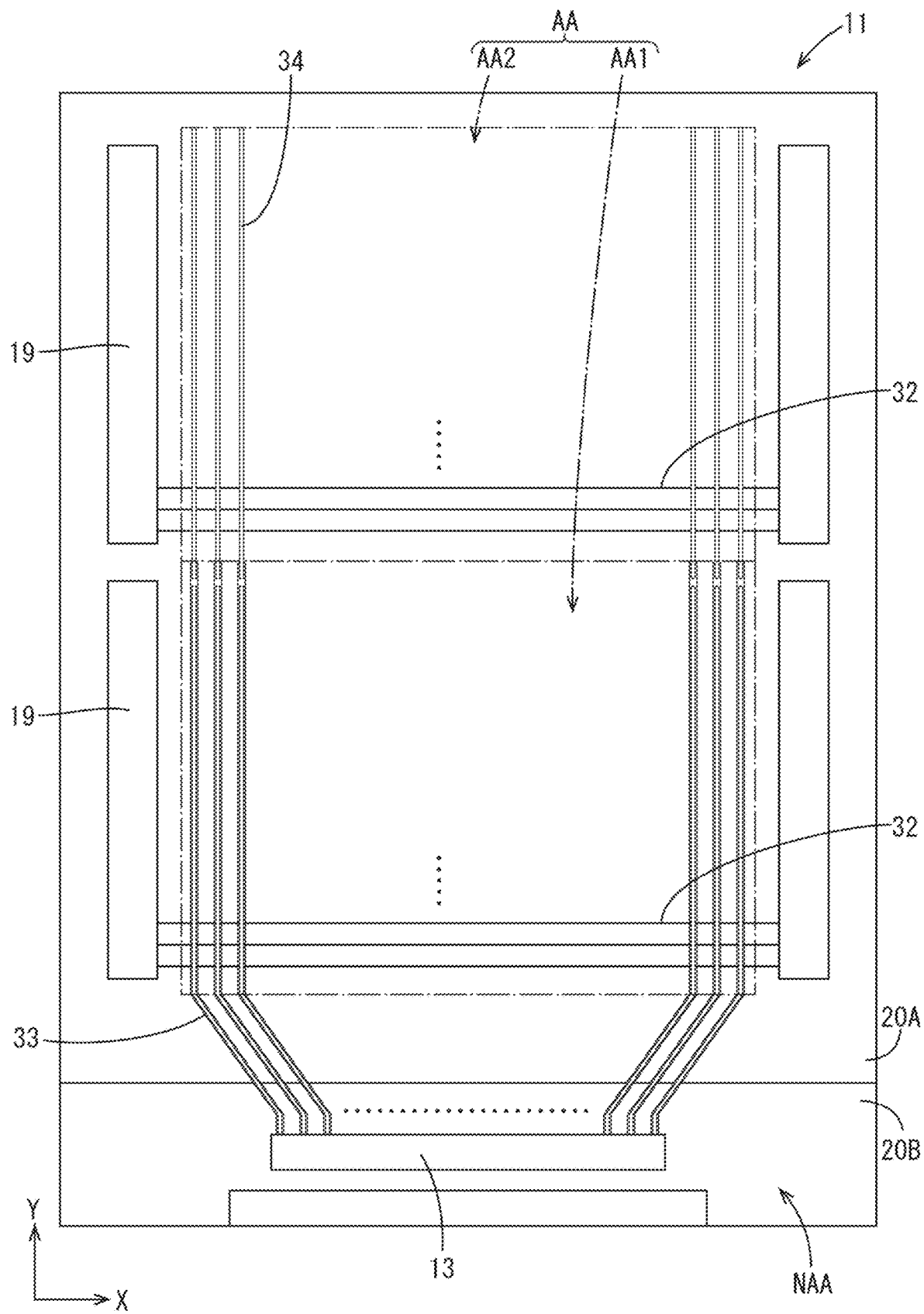
FIG. 2 is a plan view of a liquid crystal panel included in the liquid crystal display device according to the first embodiment.

As illustrated in FIG. 2, the liquid crystal panel 11 has a vertically-long rectangular shape as a whole. A display surface of the liquid crystal panel 11 is divided into the display region AA on which an image is displayed, and a non-display region NAA which has a frame shape to surround the display region AA and on which the image is not displayed. For reference, in FIG. 2, an alternate long and short dash line at an inner side indicates an appearance of the display region AA, and a region outside the alternate long and short dash line at the inner side corresponds to the non-display region NAA. Note that a short-side direction of the liquid crystal panel 11 corresponds to the X-axis direction in each drawing, and a long-side direction of the liquid crystal panel 11 corresponds to the Y-axis direction in each drawing. As will be described later in detail, the display region AA is divided into two regions including a first region AA1 and a second region AA2 in the Y-axis direction, and two pairs of gate drivers 19 are provided so as to correspond to the two regions AA1 and AA2, respectively. Each pair of gate drivers 19 is provided in the non-display region NAA of the liquid crystal panel 11, and is disposed to sandwich the first region AA1 or the second region AA2 at opposite sides of the first region AA1 or the second region AA2 in the X-axis direction.

The liquid crystal panel 11 includes a pair of substrates 20A and 20B which is substantially transparent and has an excellent light transmittance, and a liquid crystal layer 21 (see FIGS. 4 and 5) containing liquid crystal molecules and interposed between the substrates 20A and 20B, the liquid crystal molecules being a substance having an optical property that varies when an electric field is applied, and the substrates 20A and 20B are bonded to each other by a sealing material 22 while having a cell gap therebetween, the cell gap corresponding to a thickness of the liquid crystal layer 21. One of the pair of substrates 20A and 20B constituting the liquid crystal panel 11 at the front side (front surface side) is a CF substrate (facing substrate) 20A, and the other one at the back side (back surface side) is an array substrate (a thin-film transistor (TFT) substrate, a display substrate, or an active matrix substrate) 20B. The CF substrate 20A and the array substrate 20B each are formed by stacking various types of films on an inner surface side of a glass substrate GS. Further, polarizing plates 23A and 23B are bonded to outer surfaces of the substrates 20A and 20B, respectively. Note that the array substrate 20B is larger than the CF substrate 20A, so that part (the lower side of FIG. 2) of the array substrate 20B extends from the CF substrate 20A, and the source driver 13 and the flexible substrate 14 described above are mounted on the extended part (constituting the non-display region NAA), as illustrated in FIG. 2.

Figure 3:
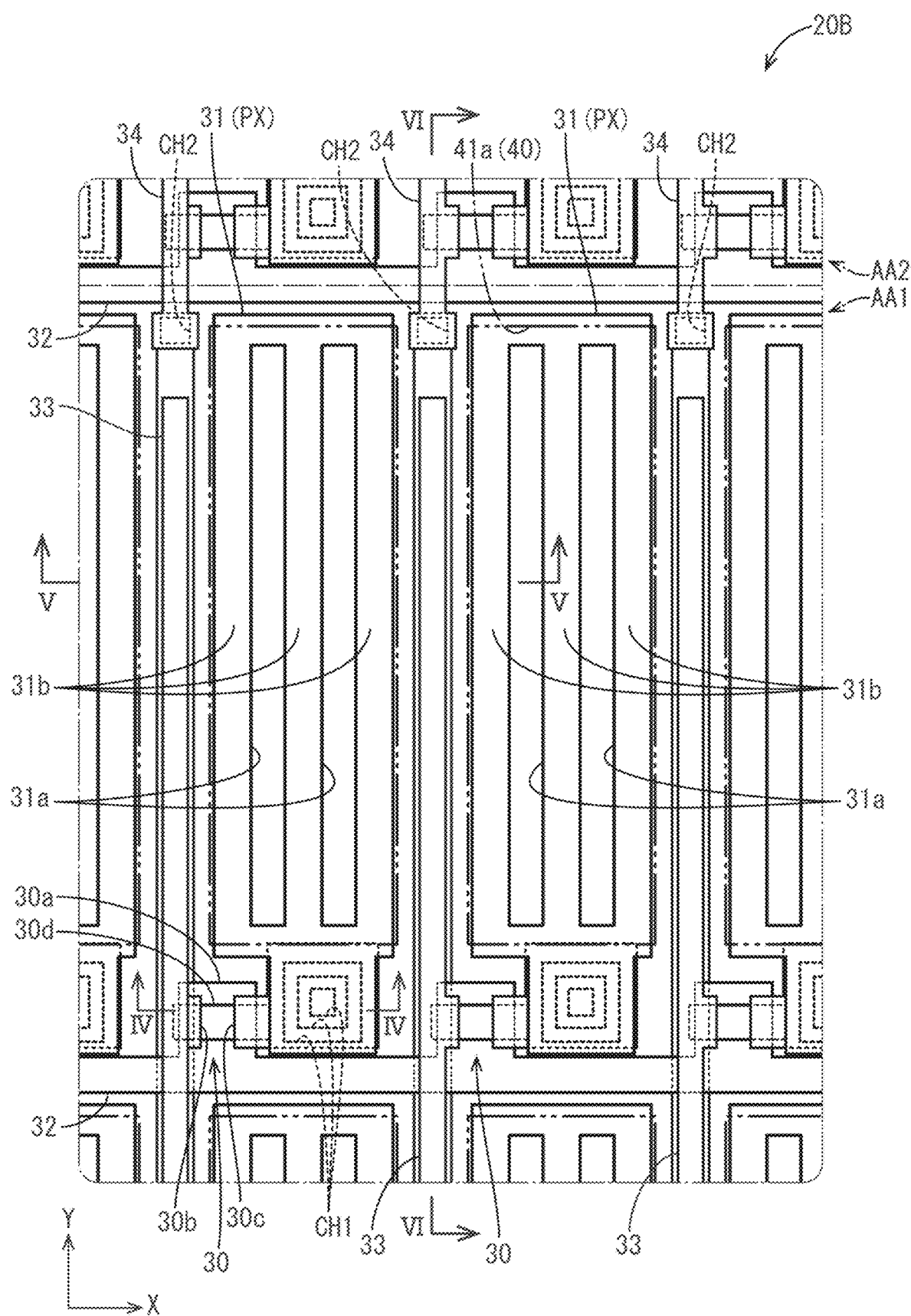
FIG. 3 is a plan view illustrating a pixel arrangement of the liquid crystal panel illustrated in FIG. 2.

Next, an internal structure of the liquid crystal panel 11 will be described. As illustrated in FIG. 3, thin film transistors (TFTs) 30 which are switching elements, and multiple pixel electrodes 31 are arranged in a matrix form in the X-axis direction and the Y-axis direction on the inner surface side the array substrate 20B in the display region AA, and gate lines (scanning line) 32 and source lines (a signal line and a data line) 33 and 34, which form a substantial lattice shape, are arranged so as to surround the TFTs 30 and the pixel electrodes 31. The gate line 32 extends in the X-axis direction, and the source lines 33 and 34 extend in the Y-axis direction. The display region AA is divided into the first region AA1 and the second region AA2 as described above, and the array substrate 20B includes a first source line (first data line 33) associated with the TFT 30 and the pixel electrode 31 present in the first region, and a second source line (second data line) 34 associated with the TFT 30 and the pixel electrode 31 present in the second region. In the first region, the first source line 33 and the second source line 34 are arranged so as to overlap with each other in plan view. That is, according to the present embodiment, the Y-axis direction is a first direction and the X-axis direction is a second direction.

Figure 4:
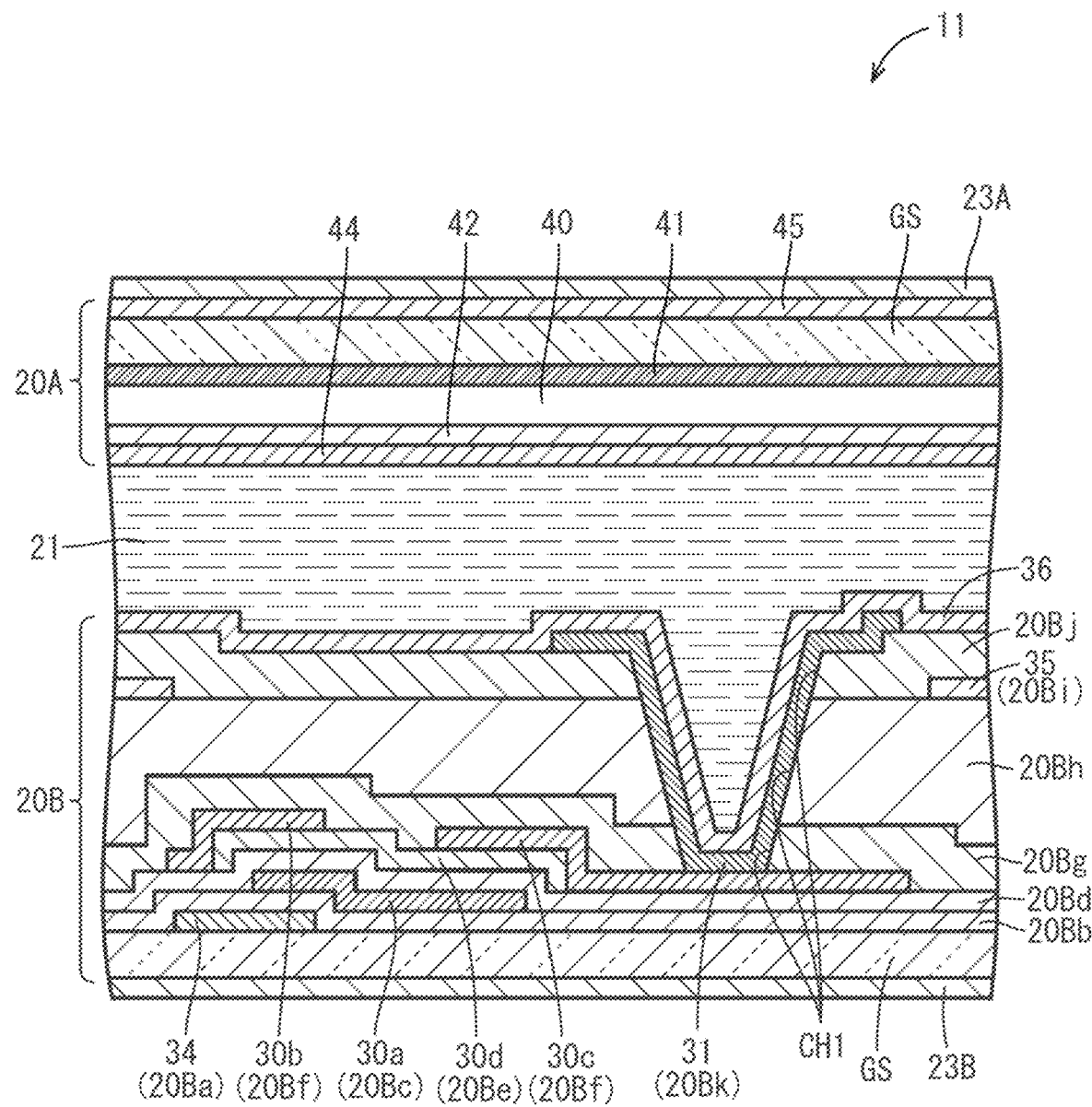
FIG. 4 is a cross-sectional view of an array substrate taken along line IV-IV of FIG. 3.
Figure 5:
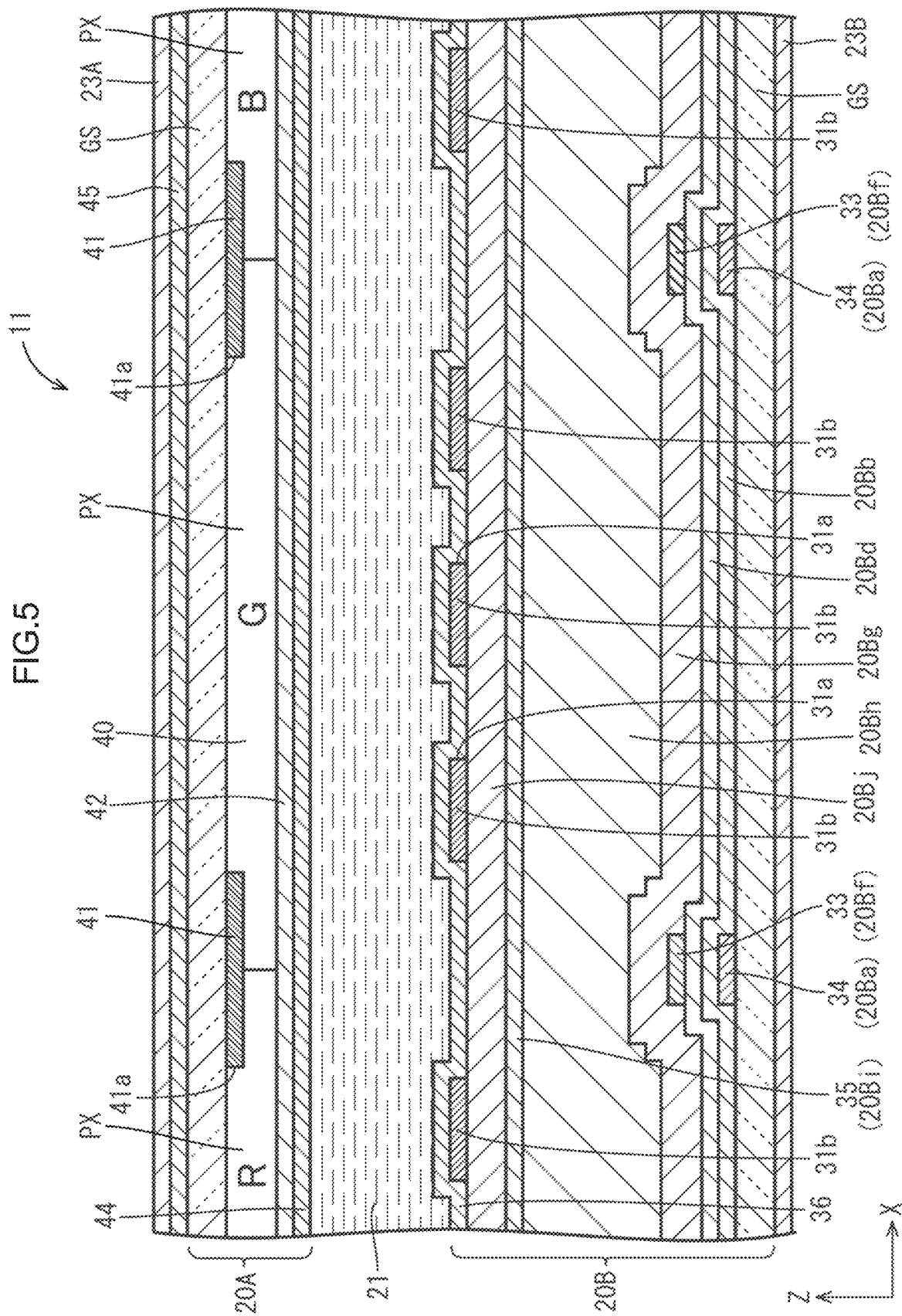
FIG. 5 is a cross-sectional view of the array substrate taken along line V-V of FIG. 3.

As illustrated in FIGS. 4 and 5, the TFT 30 is disposed to be adjacent to the pixel electrode 31 as a connection target in the Z-axis direction at the lower side of FIG. 4. A gate electrode 30a constituting the TFT 30 is branched off from the gate line 32 and formed so as to protrude in the Y-axis direction. A source electrode 30b constituting the TFT 30 is formed of parts of the source lines 33 and 34, and is connected to one end of a channel region 30d. A drain electrode 30c constituting the TFT 30 is disposed to be spaced apart from the source electrode 30b in the X-axis direction, and has one end connected to the other end (an end opposite to an end close to the source electrode 30b) of the channel region 30d, and the other end connected to the pixel electrode 31. The channel region 30d constituting the TFT 30 overlaps with the gate electrode 30a, and extends in the X-axis direction such that opposite ends thereof are connected to the source electrode 30b and the drain electrode 30c, respectively. Further, once the TFT 30 is driven on the basis of a scanning signal supplied to the gate electrode 30a, a data signal (image signal and electric charge) supplied to the source lines 33 and 34 is supplied from the source electrode 30b to the drain electrode 30c through the channel region 30d. As a result, the pixel electrode 31 is charged to a potential based on the data signal.

A plurality of silts 31a (two slits in FIG. 3) extending in a long-side direction (Y-axis direction) of the pixel electrode 31 are formed in the pixel electrode 31. That is, the pixel electrode 31 is split into three split electrodes 31b by the two slits 31a, and the split electrodes 31b and the slits 31a are alternately arranged in the X-axis direction (a short-side direction of the pixel electrode 31). Further, a substantially solid common electrode 35 is formed so as to overlap with the pixel electrode 31 in the display region AA of the array substrate 20B. Specifically, the common electrode 35 is formed inside the array substrate 20B over almost the entire display region AA, and disposed so as to overlap with all pixel electrodes 31 disposed in the display region AA. Further, a substantially constant reference potential is supplied to the common electrode 35 at all times, and as the pixel electrode 31 is charged, a potential difference is generated between the pixel electrode 31 and the common electrode 35 overlapping with each other. Once the potential difference is generated between the pixel electrode 31 and the common electrode 35 overlapping with each other, a horizontal electric field is generated between an edge portion of the slit 31a in the pixel electrode 31 and the common electrode 35, so that an alignment state of the liquid crystal molecules contained in the liquid crystal layer 21 and a transmitted light intensity of the pixel electrode 31 are controlled by the horizontal electric field. That is, an operation mode of the liquid crystal display device 10 according to the present embodiment is a fringe field switching (FFS) mode. Note that an alignment film 36 for anchoring the liquid crystal molecules contained in the liquid crystal layer 21 is disposed on an innermost surface of the array substrate 20B adjacent to the liquid crystal layer 21 so as to cover the common electrode 35.

Meanwhile, as illustrated in FIG. 5, at least three-color color filters 40 each arranged so as to overlap with each pixel electrode 31, a light shielding portion (black matrix) 41 partitioning the adjacent color filters 40, and an overcoat film 42 are provided on the inner surface side of the CF substrate 20A in the display region AA. Multiple color filters 40 showing different colors from one another are repeatedly arranged along the gate line 32 (X-axis direction), and extend along the source lines 33 and 34 (Y-axis direction) to be arranged in a stripe form as a whole. The color filters 40 are arranged so as to overlap with the pixel electrodes 31 in the array substrate 20B, respectively, in plan view. The color filters 40 adjacent to one another in the X-axis direction and showing different colors from one another are arranged such that a boundary (color boundary) therebetween overlaps with the source lines 33 and 34, and the light shielding portion 41 as described later. In the liquid crystal panel 11, the three-color color filters 40 arranged in the X-axis direction, and three pixel electrodes 31 respectively facing the color filters 40 constitute pixel portions PX of three colors, respectively.

The light shielding portion (black matrix) 41 which shields light is formed on the inner surface side of the CF substrate 20A in the display region AA as illustrated in FIGS. 3 to 5. Note that an edge of the light shielding portion 41 is indicated by a line with alternating long and two short dashes line in FIG. 3. The light shielding portion 41 has a substantial lattice shape in plan view so as to partition the adjacent pixel portions PX (pixel electrodes 31), and a pixel opening portion 41a through which the light is transmitted is provided in the light shielding portion 41 at a position at which the pixel opening portion 41a overlaps with almost an entire part of the pixel electrode 31 in the array substrate 20B in plan view. Multiple pixel opening portions 41a are arranged inside the CF substrate 20A in a matrix form in the X-axis direction and the Y-axis direction similarly to the pixel electrodes 31. Further, the light shielding portion 41 is disposed so as to overlap with the gate line 32, and the source lines 33 and 34 in the array substrate 20B in plan view.

The overcoat film 42 is stacked on an inner surface side of (above) the color filter 40 and functions to planarize an inner surface of the CF substrate 20A. Further, the alignment film 44 is disposed on the innermost surface of the CF substrate 20A adjacent to the liquid crystal layer 21 so as to cover the overcoat film 42.

A conductive layer 45 for preventing electrification is provided on an outer surface of the CF substrate 20A. The conductive layer 45 is electrically connected to a ground circuit through a predetermined connection member to release, to the ground circuit, electric charge applied to a surface of the CF substrate 20A. As a result, electrification of the surface hardly occurs, so that disorder in the alignment state of the liquid crystal molecules contained in the liquid crystal layer 21 hardly occurs, and thus a display failure also hardly occurs. The conductive layer 45 is formed of a solid transparent electrode film, such as an indium tin oxide (ITO) film, formed over almost the entire region of the outer surface of the CF substrate 20A.

Next, referring to FIGS. 6 and 7 in addition to FIGS. 4 and 5, various types of films stacked on the inner surface side of the array substrate 20B will be described, and a structure of the two source lines 33 and 34 will be described in detail. A first metal film (first source metal) 20Ba, a source insulating film 20Bb, a second metal film (gate metal) 20Bc, a gate insulating film 20Bd, a semiconductor film 20Be, a third metal film (second source metal) 20Bf, a first interlayer insulating film 20Bg, a planarizing film 20Bh, a first transparent electrode film 20Bi, a second interlayer insulating film 20Bj, a second transparent electrode film 20Bk, and the alignment film 36 are stacked in this order from below (a side close to the glass substrate GS) of the array substrate 20B on the glass substrate GS constituting the array substrate 20B. Note that the planarizing film 20Bh to the alignment film 36 are omitted in FIGS. 6 and 7.

Each of the first metal film 20Ba, the second metal film 20Bc, and the third metal film 20Bf is a single-layer film formed of one metal material selected from aluminum (Al), copper (Cu), titanium (Ti), molybdenum (Mo), and the like, or a stacked film or an alloy formed of metal materials different from each other, to have conductivity and a light shielding property, and is disposed so as to straddle the display region AA and the non-display region NAA. The first metal film 20Ba constitutes a portion of the second source line 34 for the first region AA1, and functions as a connection metal film. The second metal film 20Bc constitutes the gate line 32, the gate electrode 30a of the TFT 30, and the like, and functions as a scanning line metal film. The third metal film 20Bf constitutes the first source line 33 and a portion of the second source line 34 for the second region AA2, the source electrode 30b and the drain electrode 30c of the TFT 30, and the like, and functions as a main metal film.

Each of the source insulating film 20Bb, the gate insulating film 20Bd, the first interlayer insulating film 20Bg, and the second interlayer insulating film 20Bj is formed of an inorganic material such as silicon nitride ($SiN_x$) or silicon oxide ($SiO_2$). Each of the insulating films 20Bb, 20Bd, 20Bg, and 20Bj formed of the inorganic material is disposed to straddle the display region AA and the non-display region NAA. Each of the insulating films 20Bb, 20Bd, 20Bg, and 20Bj formed of the inorganic material has a thickness smaller than that of the planarizing film 20Bh as described later. The planarizing film 20Bh is formed of an organic material such as an acrylic resin (for example, poly(methyl methacrylate) (PMMA)), and has a function of planarizing steps generated below the planarizing film 20Bh.

The semiconductor film 20Be is a thin film formed by using amorphous silicon, an oxide semiconductor, or the like as a material, and constitutes, for example, the channel portion (semiconductor portion) 30d connected to the source electrode 30b and the drain electrode 30c in the TFT 30. Each of the first transparent electrode film 20Bi and the second transparent electrode film 20Bk is formed of a transparent electrode material (for example, ITO or indium zinc oxide (IZO)), and is disposed to straddle the display region AA and the non-display region NAA. The first transparent electrode film 20Bi constitutes the common electrode 35 and the like, and the second transparent electrode film 20Bk constitutes the pixel electrode 31 and the like. That is, the pixel electrode 31 is disposed to be closer to the liquid crystal layer 21 than the common electrode 35 is. Further, contact holes CH1 for connecting the pixel electrode 31 constituted by the second transparent electrode film 20Bk to the drain electrode 30c constituted by the third metal film 20Bf are formed in the first interlayer insulating film 20Bg, the planarizing film 20Bh, and the second interlayer insulating film 20Bj, respectively. The contact hole CH1 is disposed at a position overlapping with both of the pixel electrode 31 and the drain electrode 30c in plan view. Further, the alignment film 36 is formed of, for example, polyimide, and is formed at least over almost the entire display region AA.

As illustrated in FIG. 3, the third metal film 20Bf extends between the pixel electrodes 31 adjacent to each other in the X-axis direction, in the Y-axis direction while having a substantially constant width. Further, the third metal film 20Bf is cut at a position near a boundary between the first region AA1 and the second region AA2, specifically, at a position in the first region AA1 near the boundary line. Further, a portion 20Bf1 of the third metal film 20Bf for the first region AA1 functions as the first source line 33, and a portion 20Bf2 of the third metal film 20Bf for the second region AA2 functions as part of the second source line 34.

Figure 6:
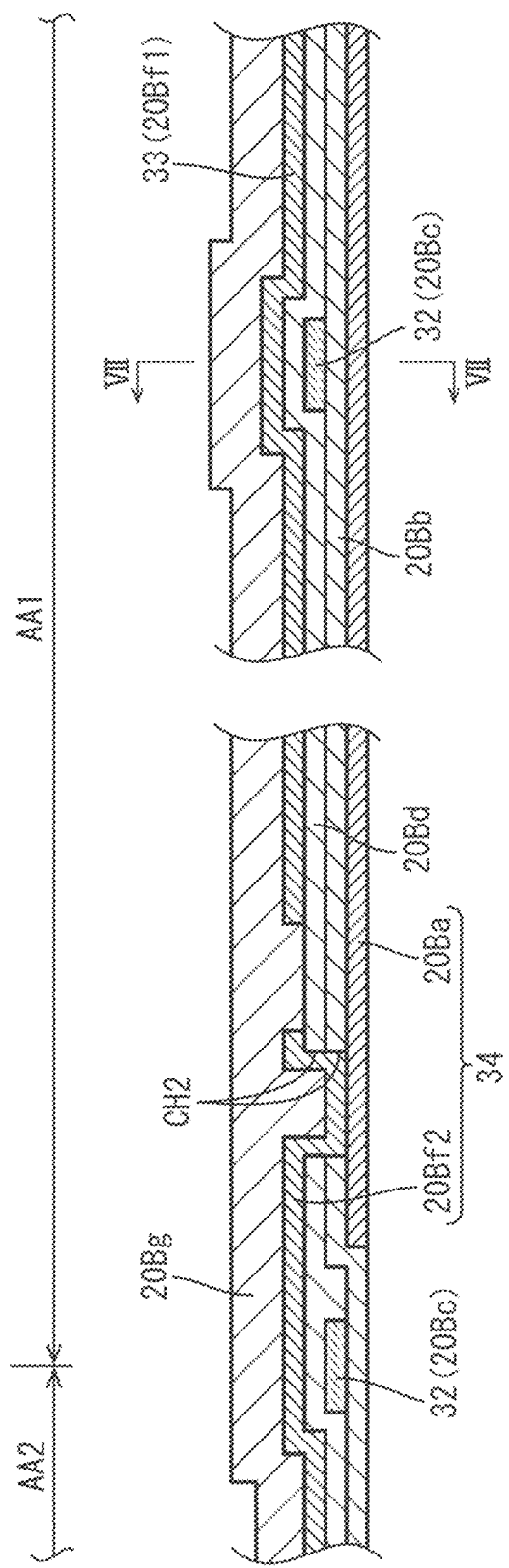
FIG. 6 is a cross-sectional view of the array substrate taken along line VI-VI of FIG. 3.

Further, as illustrated in FIGS. 3 and 6, the first metal film 20Ba is formed below the third metal film 20Bf while extending parallel to the third metal film 20Bf. However, the first metal film 20Ba is formed only in the first region AA1. An end of the first metal film 20Ba and an end of the portion 20Bf2 of the third metal film 20Bf for the second region AA2 overlap with each other in plan view, the end of the first metal film 20Ba being close to the second region, and the end of the portion 20Bf2 of the third metal film 20Bf for the second region AA2 being in the first region AA1. Further, as illustrated in FIG. 6, contact holes CH2 are formed in the source insulating film 20Bb and the gate insulating film 20Bd at positions at which the first metal film 20Ba and the portion 20Bf2 of the third metal film 20Bf for the second region AA2 overlap with each other, so that the first metal film 20Ba and the portion 20Bf2 of the third metal film 20Bf for the second region AA2 are connected to each other. With such a configuration, the second source line 34 is formed of the first metal film 20Ba and the third metal film 20Bf.

With the configuration as described above, the first source line 33 that is a portion of the third metal film 20Bf and the second source line 34 that is a portion of the first metal film 20Ba overlap with each other in the first region AA1. For reference, in the liquid crystal display device 10 according to the present embodiment, the first source line 33 that is a portion of the third metal film 20Bf and the second source line 34 that is a portion of the first metal film 20Ba have substantially the same widths in the X-axis direction as illustrated in FIGS. 5 and 7.

The first source line 33 and the second source line 34 both are led out from a lower side of the first region AA1 to be connected to the same source driver 13. Further, since the first source line 33 and the second source line 34 are disposed so as to overlap with each other in the first region AA1, the liquid crystal display device 10 according to the present embodiment also has a characteristic regarding a method of driving the two source lines 33 and 34.

The liquid crystal display device 10 is driven by a so-called "frame reversal driving" in which a polarity is reversed every period for displaying one frame, and a potential (positive potential) relatively higher than a common voltage $V_{COM}$ of the common electrode 35 and a potential (negative potential) relatively lower than the common voltage $V_{COM}$ of the common electrode 35 are alternately supplied to the pixel electrode 31 through the source lines 33 and 34, and the TFT 30 every period for displaying one frame. More specifically describing a method of driving the liquid crystal display device 10, the liquid crystal display device 10 is driven by dot reversal driving in which reversal of a positive polarity and a negative polarity is performed alternately in both of a row direction and a column direction.

Figure 9:
FIG. 9 is a diagram illustrating another example of data signals input to the first source line and the second source line, respectively, in the liquid crystal display device according to the first embodiment.

As an example, FIG. 8A illustrates data signals input to the first source line 33 and the second source line 34, respectively, in a case where the first region AA1 and the second region AA2 have the same gradation level when displaying a white screen in a normally black mode. As illustrated in FIG. 8A, in the liquid crystal display device 10, the data signal input to the first source line 33 and the data signal input to the second source line 34 have the same polarities. In this case, since the data signal input to the first source line 33 and the data signal input to the second source line 34 also have the same magnitudes (have the gradation levels), no potential difference is generated. Further, even in a case where the data signal input to the first source line 33 and the data signal input to the second source line 34 have magnitudes different from each other (have different graduation levels), a potential difference is smaller than those of a case where the data signal input to the first source line 33 and the data signal input to the second source line 34 are input while being inverted inversely with respect to each other as illustrated in FIG. 8B, and a case where a timing at which a polarity of the data signal of the first source line 33 is reversed and a timing at which a polarity of the data signal of the second source line 34 is reversed are different from each other as illustrated in FIG. 8C. Therefore, according to the method of driving the liquid crystal display device 10, it is possible to further suppress signal delay caused by the potential difference between the data signal of the first source line and the data signal of the second source line 34, in comparison to the driving methods illustrated in FIGS. 8B and 8C. Note that although the liquid crystal display device 10 adopts the dot reversal driving, the present technology is not limited thereto, and it is also possible to adopt column reversal driving in which reversal of a positive polarity and a negative polarity is performed for each source line, that is, for each column as illustrated in FIG. 9.

As described above, the liquid crystal display device 10 according to the present embodiment includes the array substrate 20B including (A) the plurality of pixel electrodes 31 arranged in a matrix form in the Y-axis direction (first direction) and the X-axis direction (second direction) intersecting with each other, (B) the first source line (first data line) 33 for supplying a data signal to the pixel electrodes 31 disposed in the first region AA1 among the plurality of pixel electrodes 31, the first source line 33 extending in the Y-axis direction, and the first region AA1 being a region close to one ends of the plurality of pixel electrodes 31 in the Y-axis direction, and (C) the second source line (second data line) 34 for supplying a data signal to the pixel electrodes 31 disposed in the second region AA2 among the plurality of pixel electrodes 31, the second source line 34 extending in the first direction, and the second region AA2 being a region closer to the other ends of the plurality of pixel electrodes 31 in the Y-axis direction than the first region AA1 is, and the source driver (driver circuit) 13 which is disposed close to the one ends of the plurality of pixel electrodes 31 in the Y-axis direction and supplies a data signal to each of the plurality of pixel electrodes 31 through the first source line 33 and the second source line 34, and the first source line 33 and the second source line 34 are disposed so as to overlap with each other in the first region AA1.

With such a configuration, in the liquid crystal display device 10, the pixel electrodes 31 in the two regions can be driven (charged) independently only with the source driver 13 provided close to the one ends of the plurality of pixel electrodes 31 in the Y-axis direction, and thus it is possible to increase a charge time for each pixel electrode 31 or implement a high definition and high frequency driving (high refresh rate) without increasing an area of the non-display region NAA (while maintaining a narrow frame width). In addition, since the first source line 33 and the second source line are disposed so as to overlap with each other in the liquid crystal display device 10, an opening ratio is not decreased.

Further, in the liquid crystal display device 10, a portion of the first source line (first data line) 33 extending in the first region AA1, and a portion of the second source line (second data line) 34 extending in the second region AA2 are portions of the same metal film, that is, the third metal film (main metal film) 20Bf, and a portion of the second source line 34 extending in the first region AA1 is a portion of the first metal film (connection metal film) 20Ba which is different from the third metal film 20Bf, so that the second source line 34 is formed by connecting the first metal film 20Ba and the third metal film 20Bf to each other. In other words, since the first source line 33 connected to the pixel electrodes 31 in the first region AA1 and the portion of the second source line 34 connected to the pixel electrodes 31 in the second region AA2 are portions of the same metal film, that is, the third metal film 20Bf, it is possible to suppress occurrence of a data signal transmission error between data signal transmission from the first source line 33 to the pixel electrodes 31, and data signal transmission from the second source line 34 to the pixel electrodes.

Figure 7:
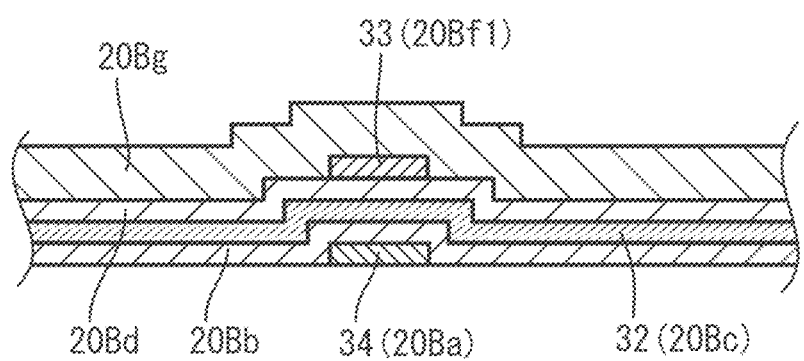
FIG. 7 is a cross-sectional view taken along line VII-VII of FIG. 6.

Further, in the liquid crystal display device 10, the first metal film (connection metal film) 20Ba forming the second source line 34 is disposed below the second metal film (scanning line metal film) 20Bc, and the third metal film (main metal film) 20Bf forming the first source line 33 is disposed above the second metal film 20Bc as illustrated in FIG. 7, so that the first source line 33 is disposed above the second source line 34 in the first region AA1. With such a configuration, the source insulating film 20Bb and the gate insulating film 20Bd are present between the second source line 34 and the first source line 33 as illustrated in FIGS. and 6, and as a result, it is possible to suppress occurrence of the signal delay caused by the potential difference between the data signal of the first source line and the data signal of the second source line 34, in comparison to a case where only one layer of insulating film is provided.

Modified Example 1

Figure 10:
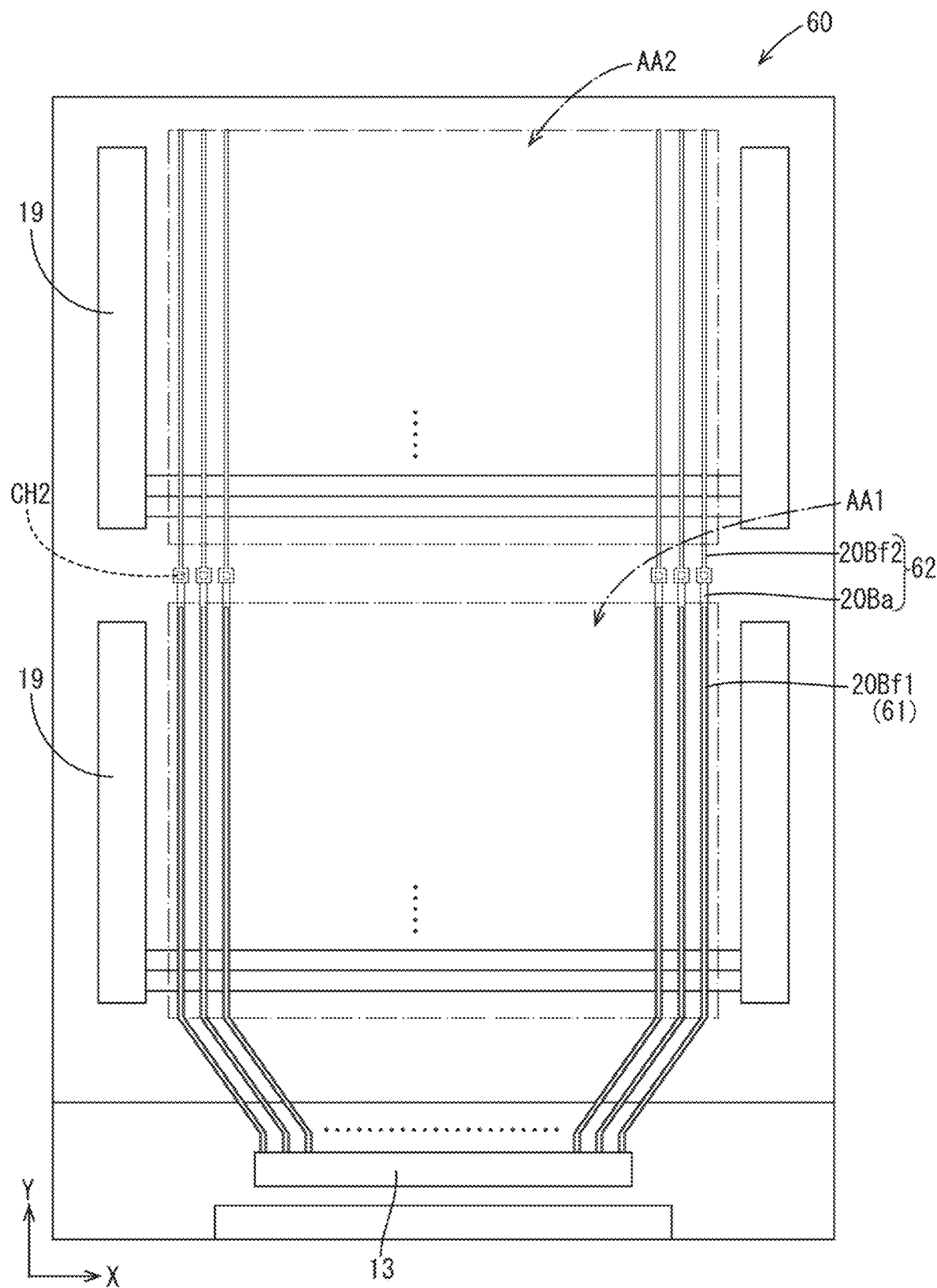
FIG. 10 is a plan view of a liquid crystal panel included in a liquid crystal display device according to a modified example of the first embodiment.

In the liquid crystal display device 10 according to the first embodiment, the display region AA is divided into the first region AA1 and the second region AA2. Whereas, in a liquid crystal display device 60 according to the modified example, two display regions arranged in the Y-axis direction are provided and the two display regions become the first region AA1 and the second region AA2, respectively, as illustrated in FIG. 10. Similarly to the liquid crystal display device 10 according to the first embodiment, in the liquid crystal display device 60 according to the modified example, respective screens of the two display regions AA1 and AA2 are driven by a single source driver 13 provided close to one ends (the lower side of FIG. 10) of a plurality of pixel electrodes in the Y-axis direction. Further, similarly to the liquid crystal display device 10 according to the first embodiment, a first source line 61 for supplying a data signal to the pixel electrodes in the first region AA1, and a second source line 62 for supplying a data signal to the pixel electrodes in the second region AA2 are disposed so as to overlap with each other in the first region AA1. Accordingly, it is possible to implement a narrow frame width or a high definition without decreasing an opening ratio, and to secure a charge time for each pixel or implement a high refresh rate in the liquid crystal display device 60 according to the modified example as well, similarly to the liquid crystal display device 10 according to the first embodiment.

Further, in the liquid crystal display device 60 according to the present modified example, the second source line 62 is formed of the first metal film 20Ba and the third metal film 20Bf, similarly to the second source line 34 in the liquid crystal display device 10 according to the first embodiment (see FIG. 6). However, the first metal film 20Ba extends up to a portion between the first region AA1 and the second region AA2, and the portion 20Bf2 of the third metal film 20Bf for the second region AA2 extends up to the portion between the first region AA1 and the second region as illustrated in FIG. 10. Further, these ends overlap with each other in the portion between the first region AA1 and the second region and are connected to each other by the contact holes CH2. In the liquid crystal display device 60 according to the present modified example, since the contact holes CH2 are positioned in the non-display region, it is possible to increase an area of a region in which the ends are in contact with each other, so that more reliable contact between the ends can be achieved.

Modified Example 2

Figure 11:
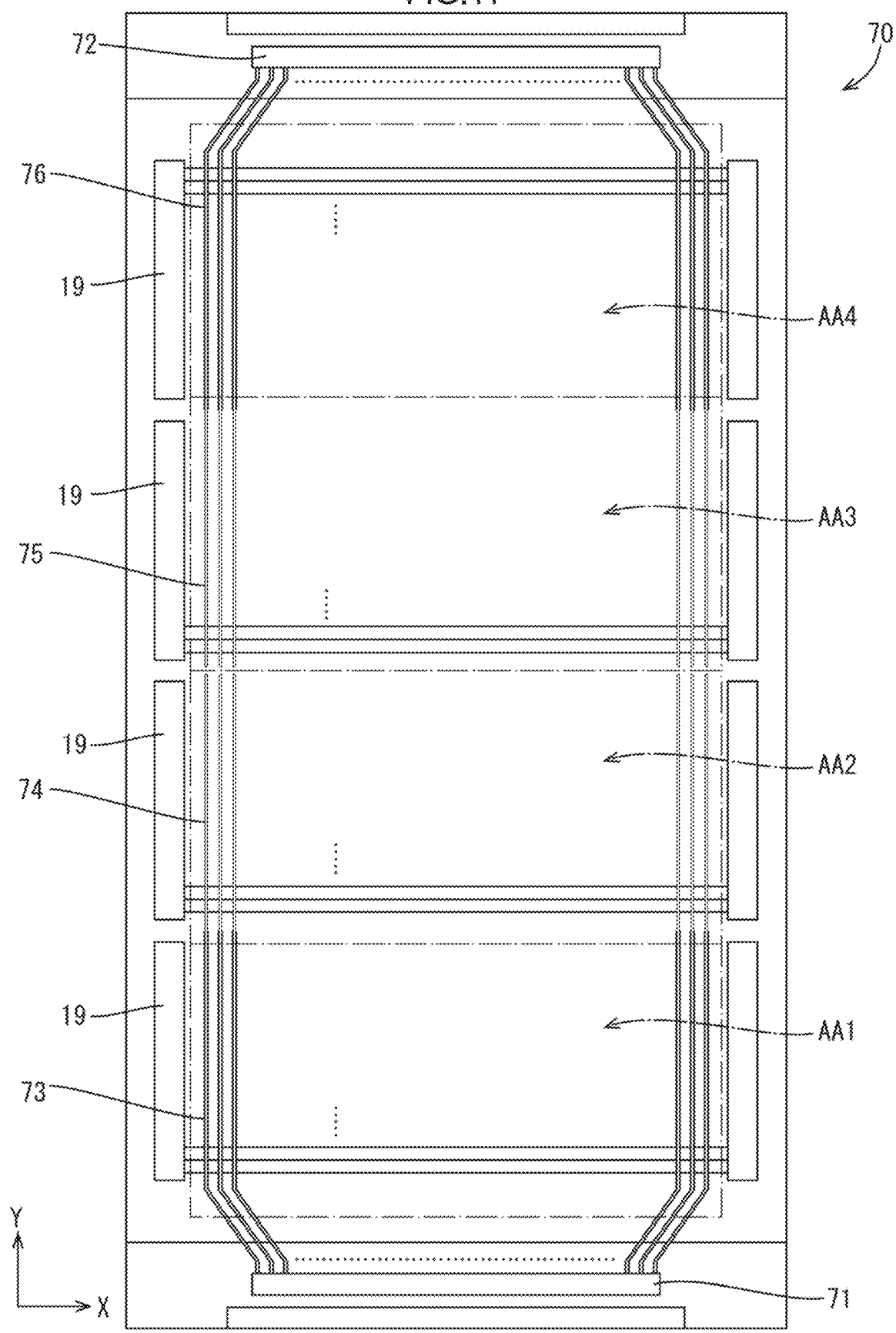
FIG. 11 is a plan view of a liquid crystal panel included in a liquid crystal display device according to another modified example of the first embodiment.

In the liquid crystal display device 10 according to the first embodiment, the display region AA is divided into the first region AA1 and the second region AA2. Whereas, in a liquid crystal display device 70 according to the modified example, a display region AA is divided into four display regions AA1, AA2, AA3, and AA4 in the Y-axis direction as illustrated in FIG. 11. Further, in the liquid crystal display device 70 according to the modified example, a first source driver (driver circuit) 71 is provided close to one ends (the lower side of FIG. 11) of a plurality of pixel electrodes in the Y-axis direction, and a second source driver (driver circuit) 72 is provided close to the other ends (the upper side of FIG. 11) of the plurality of pixel electrodes in the Y-axis direction. The first source driver 71 is used to supply a data signal to the pixel electrodes in the first region AA1 and the second region AA2, and the second source driver 72 is used to supply a data signal to the pixel electrodes in the third region AA3 and the fourth region AA4. Further, a configuration in which respective screens of the first region AA1 and the second region AA2 are driven by the first source driver 71, and a configuration in which a first source line (first data line) 73 for supplying a data signal to the pixel electrodes in the first region AA1, and a second source line (second data line) 74 for supplying a data signal to the pixel electrodes in the second region AA2 are disposed so as to overlap with each other in the first region AA1 are the same as those in the liquid crystal display device 10 according to the first embodiment. Further, a configuration in which respective screens of the third region AA3 and the fourth region AA4 are driven by the second source driver 72, and a configuration in which a third source line (second data line) 75 for supplying a data signal to the pixel electrodes in the third region AA3, and a fourth source line (first data line) 76 for supplying a data signal to the pixel electrodes in the fourth region AA4 are disposed so as to overlap with each other in the fourth region AA4 are the same as those in the liquid crystal display device 10 according to the first embodiment. Note that the second source line 74 extends up to a portion near a boundary between the second region AA2 and the third region AA3, and the third source line 75 extends up to a portion near the boundary between the second region AA2 and the third region AA3, and thus the second source line 74 and the third source line 75 are not connected to each other. Therefore, the first region AA1 and the second region AA2, and the third region AA3 and the fourth region AA4 are independent of each other.

With such a configuration, the source drivers 71 and 72 which are driver circuits are provided at opposite ends of the liquid crystal display device 70 in the Y-axis direction in the liquid crystal display device 70 according to the modified example, and thus it is difficult to implement a narrow frame width. However, it is possible to implement a higher definition and to further secure a charge time for each pixel or to implement a higher refresh rate, in comparison to the liquid crystal display device 10 according to the first embodiment.

Second Embodiment

Next, a liquid crystal display device 80 which is a display device according to a second embodiment will be described with reference to FIGS. 12 to 14. Note that the liquid crystal display device 80 according to the second embodiment has a similar configuration to that of the liquid crystal display device 10 according to the first embodiment, and the same components as those of the liquid crystal display device 10 according to the first embodiment will be denoted by the same reference symbols and a description thereof will be omitted. Further, a structure of an array substrate, specifically, a vertical positional relation between a first data line and a second data line in the liquid crystal display device 80 according to the second embodiment is different from that in the liquid crystal display device 10 according to the first embodiment. Therefore, only an internal structure of an array substrate 81 in the liquid crystal display device 80 according to the second embodiment will be described.

The number of stacked films in an array substrate 81 is the same as that in the array substrate 20B according to the first embodiment, but the array substrate 81 and the array substrate 20B are different from each other in regard to an order in which the films are stacked. A first metal film (gate metal) 81a, a gate insulating film 81b, a semiconductor film, a second metal film (first source metal) 81c, a source insulating film 81d, a third metal film (second source metal) 81e, a first interlayer insulating film 81f, a planarizing film, a first transparent electrode film, a second interlayer insulating film, a second transparent electrode film, and an alignment film are stacked in this order from below (a side close to a glass substrate GS) of the array substrate 81 on the glass substrate GS. Note that a portion above the planarizing film has the same structure as that according to the first embodiment, and thus is omitted in FIGS. 13 and 14.

Further, in the liquid crystal display device 80 according to the second embodiment, the first metal film 81a constitutes a gate line 82, a gate electrode 30a of a TFT 30, and the like, and functions as a scanning line metal film. The second metal film 81c constitutes a first source line 83 and a portion of a second source line 84 for a second region AA2, a source electrode 30b and a drain electrode 30c of the TFT 30, and the like, and functions as a main metal film. The third metal film 81e constitutes a portion of the second source line 84 for a first region AA1, and functions as a connection metal film.

Figure 12:
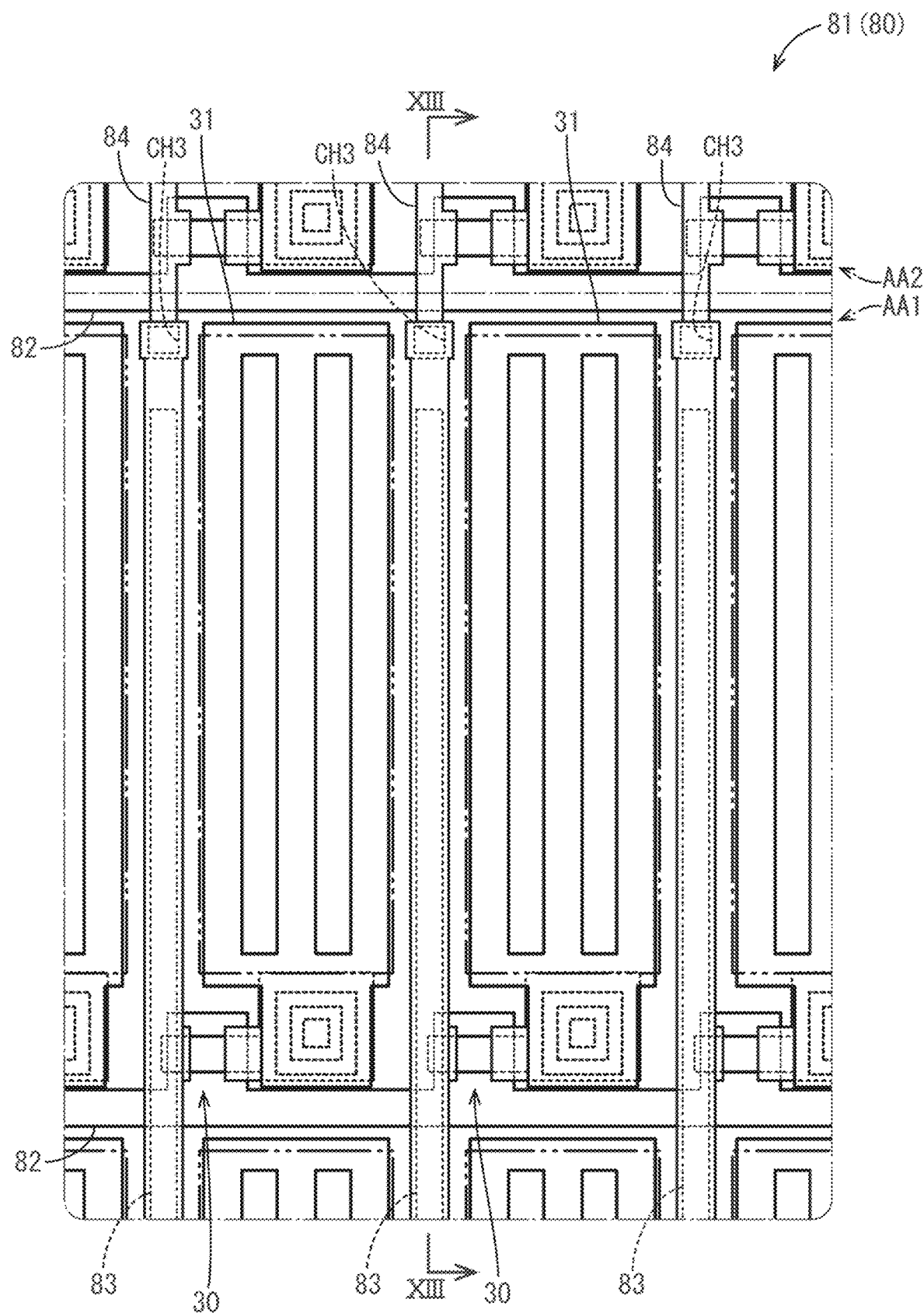
FIG. 12 is a plan view illustrating a pixel arrangement of a liquid crystal panel included in a liquid crystal display device according to a second embodiment.

As illustrated in FIG. 12, the second metal film 81c extends between pixel electrodes 31 adjacent to each other in the X-axis direction, in the Y-axis direction while having a substantially constant width. Further, the third metal film 20Bf is cut at a position near a boundary between the first region AA1 and the second region AA2, specifically, at a position in the first region AA1 near the boundary line. Further, a portion 81C1 of the second metal film 81c for the first region AA1 functions as the first source line 83, and a portion 81c2 of the second metal film 81c for the second region AA2 functions as part of the second source line 84.

Figure 13:
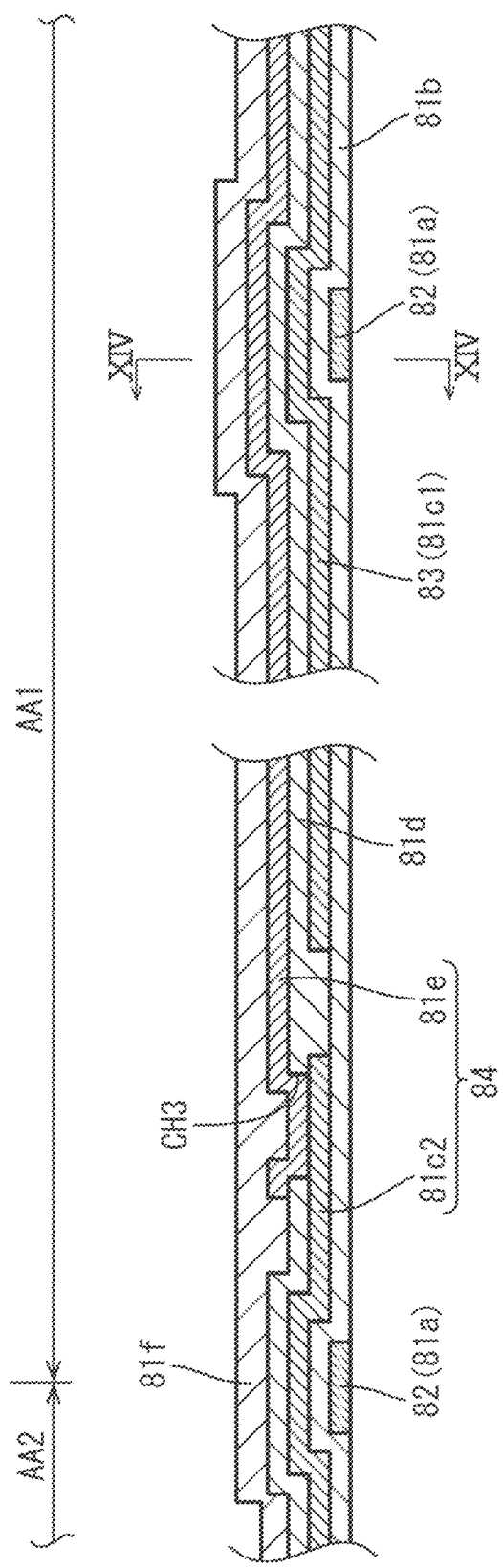
FIG. 13 is a cross-sectional view of an array substrate taken along line XIII-XIII of FIG. 12.

Further, as illustrated in FIGS. 12 and 13, the third metal film 81e is formed above the second metal film 81c while extending parallel to the second metal film 81c. However, the third metal film 81e is formed only in the first region AA1. An end of the third metal film 81e and an end of the portion 81C1 of the second metal film 81c for the first region AA1 overlap with each other in plan view, the end of the third metal film 81e being close to the second region, and the end of the portion 81C1 of the second metal film 81c for the first region AA1 being in the first region AA1. Further, as illustrated in FIG. 13, a contact hole CH3 is formed in the source insulating film 81d at a position at which the third metal film 81e and the portion 81c2 of the second metal film 81c for the second region AA2 overlap with each other, so that the third metal film 81e and the portion 81c2 of the second metal film 81c for the second region AA2 are connected to each other. With such a configuration, the second source line 84 is formed of the third metal film 81e and the portion 81c2 of the second metal film.

With the configuration as described above, in the liquid crystal display device 80 according to the second embodiment, in the first region AA1, the first source line 83 that is a portion of the second metal film 81c, and the second source line 84 that is a portion of the third metal film 81e overlap with each other. As a result, similarly to the liquid crystal display device 10 according to the first embodiment, it is possible to implement a narrow frame width or a high definition without decreasing an opening ratio, and to secure a charge time for each pixel, and implement a high refresh rate.

Further, in the liquid crystal display device 80, a portion of the first source line (first data line) 83 extending in the first region AA1, and a portion of the second source line (second data line) 84 extending in the second region AA2 are portions of the same metal film, that is, the second metal film (main metal film) 81c, and a portion of the second source line 84 extending in the first region AA1 is a portion of the third metal film (connection metal film) 81e which is different from the second metal film 81c, so that the second source line 84 is formed by connecting the third metal film 81e and the second metal film 81c to each other. Therefore, similarly to the liquid crystal display device 10 according to the first embodiment, since the first source line 83 connected to the pixel electrodes 31 in the first region AA1 and the portion of the second source line 84 connected to the pixel electrodes 31 in the second region AA2 are portions of the same metal film, that is, the second metal film 81c in the liquid crystal display device 80, it is possible to suppress occurrence of a data signal transmission error between data signal transmission from the first source line 83 to the pixel electrodes 31, and data signal transmission from the second source line 84 to the pixel electrodes.

Figure 14:
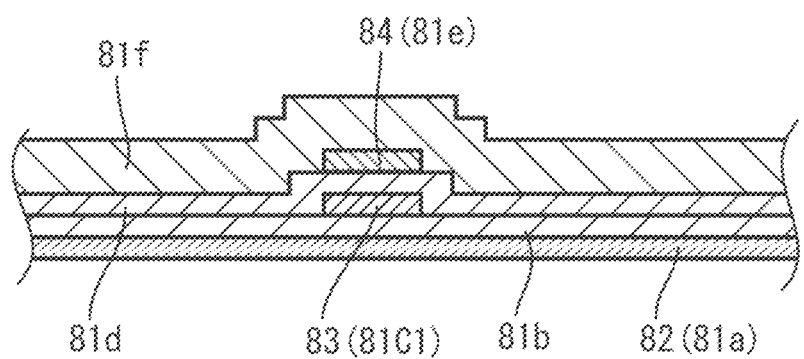
FIG. 14 is a cross-sectional view taken along line XIV-XIV of FIG. 13.

Further, in the liquid crystal display device 80, the second metal film (main metal film) 81c forming the first source line 83 is disposed above the first metal film (scanning line metal film) 81a, and the third metal film (connection metal film) 81e forming the second source line 84 is disposed above the second metal film 81c as illustrated in FIG. 14, so that the second source line 84 is disposed above the first source line 83 in the first region AA1. With such a configuration, only the source insulating film 81d is present between the first source line 83 and the second source line 84 in the first region AA1 as illustrated in FIGS. 13 and 14. As a result, it is possible to suppress occurrence of a contact failure when the third metal film 81e of the second source line 84 and the portion 81C1 of the second metal film are brought into contact with each other, in comparison to a case where two layers of insulating films are interposed as in the liquid crystal display device 10 according to the first embodiment.

Third Embodiment

A liquid crystal display device 90 which is a display device according to a third embodiment will be described with reference to FIGS. 15 to 17. Note that the liquid crystal display device 90 according to the third embodiment has a similar configuration to that of the liquid crystal display device 10 according to the first embodiment, and the same components as those of the liquid crystal display device 10 according to the first embodiment will be denoted by the same reference symbols and a description thereof will be omitted. Further, a structure of an array substrate, specifically, only a structure of an array substrate in a second region AA2 in the liquid crystal display device 90 according to the third embodiment is different from that in the liquid crystal display device 10 according to the first embodiment. Therefore, only an internal structure of an array substrate 91 in the liquid crystal display device 90 according to the third embodiment will be described.

The number of stacked films and an order in which the films are stacked in the array substrate 91 are the same as those in the array substrate 20B according to the second embodiment. A first metal film (first source metal) 91a, a source insulating film 91b, a second metal film (gate metal) 91c, a gate insulating film 91d, a semiconductor film, a third metal film (second source metal) 91f, a first interlayer insulating film 91g, a planarizing film, a first transparent electrode film, a second interlayer insulating film, a second transparent electrode film, and an alignment film are stacked in this order from below (a side close to the glass substrate GS) of the array substrate 91 on the glass substrate GS. Note that a portion above the planarizing film is omitted in FIGS. 16 and 17.

Figure 15:
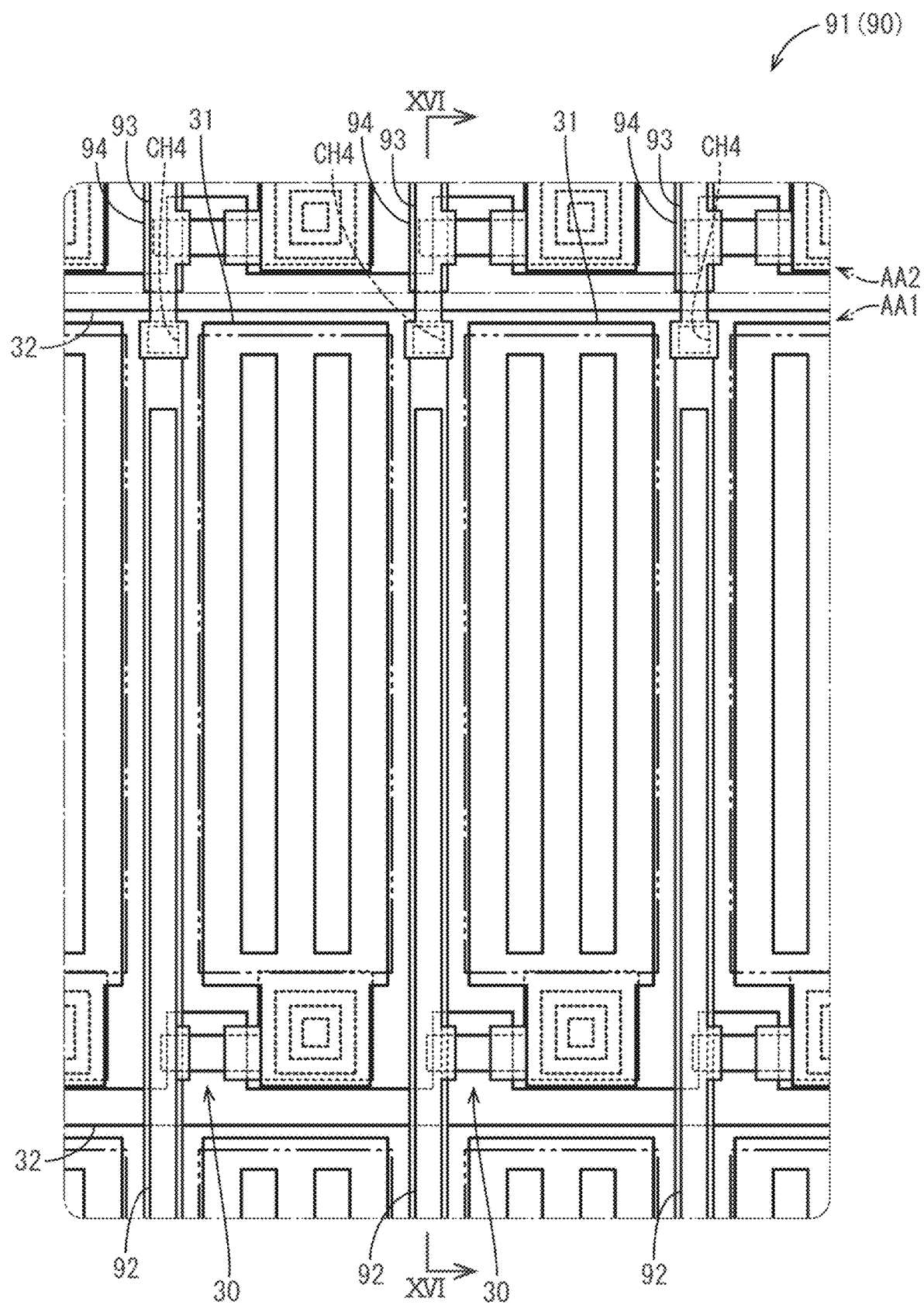
FIG. 15 is a plan view illustrating a pixel arrangement of a liquid crystal panel included in a liquid crystal display device according to a third embodiment.
Figure 16:
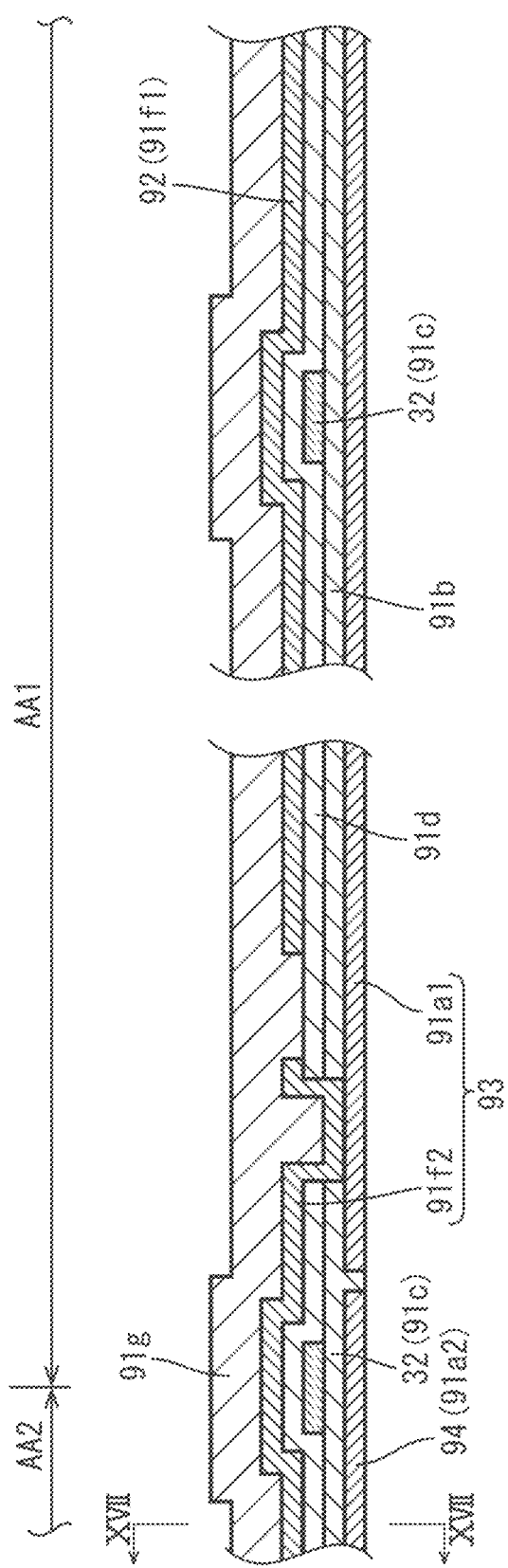
FIG. 16 is a cross-sectional view of the array substrate taken along line XVI-XVI of FIG. 15.

As illustrated in FIGS. 15 and 16, the first metal film 91a extends between pixel electrodes 31 adjacent to each other in the X-axis direction, in the Y-axis direction while having a substantially constant width. The first metal film 20Ba according to the first embodiment is formed only in a first region AA1, whereas the first metal film 91a according to the third embodiment extends also in the second region AA2 and is cut at a boundary between a first region AA1 and the second region AA2. Note that the third metal film 91f extends in both of the first region AA1 and the second region AA2 similarly to that in the first embodiment, and is cut at a position near the boundary between the first region AA1 and the second region AA2, specifically, at a position in the first region AA1 near the boundary line.

As illustrated in FIGS. 15 and 16, a portion 91f1 of the third metal film 91f for the first region AA1 functions as a first source line 92. An end of a portion 91f2 of the third metal film 91f for the second region AA2 and an end of a portion 91a1 of the first metal film 91a for the first region AA1 overlap with each other in plan view, the end of the portion 91f2 of the third metal film 91f for the second region AA2 being in the first region AA1, and the end of the portion 91a1 of the first metal film 91a for the first region AA1 being close to the second region AA2. Further, as illustrated in FIG. 16, contact holes CH4 are formed in the source insulating film 91b and the gate insulating film 91d at positions at which the portion 91a1 of the first metal film 91a for the first region AA1 and the portion 91f2 of the third metal film 91f for the second region AA2 overlap with each other, so that the portion 91a1 of the first metal film 91a for the first region AA1 and the portion 91f2 of the third metal film 91f for the second region AA2 are connected to each other. With such a configuration, a second source line 93 is formed of the first metal film 91a and the third metal film 91f. Further, a portion 91a2 of the first metal film 91a for the second region AA2 functions as a provisional source line (provisional data line) 94 disposed so as to overlap with the second source line 93.

Figure 17:
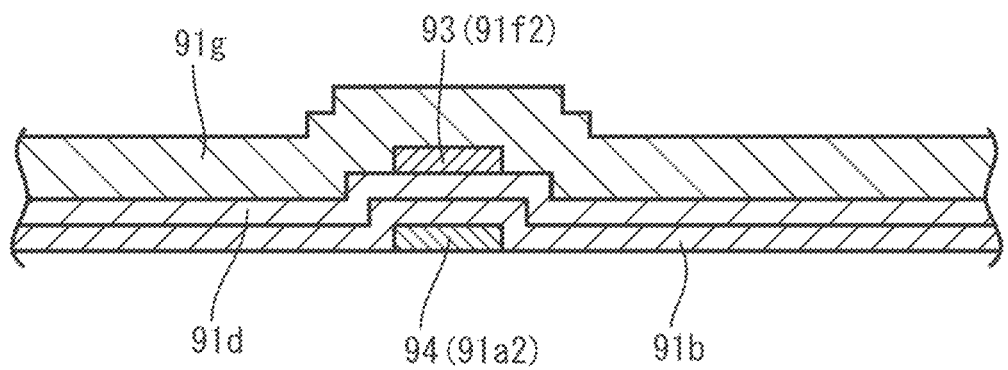
FIG. 17 is a cross-sectional view taken along line XVII-XVII of FIG. 16.

As can be appreciated by comparing FIG. 17 illustrating a cross section in the second region AA2 with FIG. 5 illustrating a cross section in the first region AA1, in the liquid crystal display device 90 according to the third embodiment, a structure in which the films are stacked in the first region AA1 and a structure in which the films are stacked in the second region AA2 are the same as each other. Therefore, in the liquid crystal display device 90, a state of light scattering caused by the metal films 91a, 91c, and 91f can be uniform across both of the first region AA1 and the second region, so that it is possible to suppress occurrence of a display failure.

The provisional source line 94 extends up to a portion at an upper side (the upper side of FIG. 2) of the second region AA2, and a signal can be input from the portion. Specifically, for example, a configuration in which a common signal (common voltage) of a common electrode 35 is input, or the same signal as a signal input to the first source line 92 or a signal having the same polarity as that of the signal input to the first source line 92 is input is possible. Further, for example, a configuration in which a contact hole for connecting the portion 91f1 of the third metal film 91f for the first region AA1 with the portion 91a2 of the first metal film 91a for the second region AA2 is provided near the boundary between the first region AA1 and the second region AA2, the third metal film 91f constituting the first source line 92, and the first metal film 91a constituting the provisional source line 94, so that a signal input to the first source line 92 is also input to the provisional source line 94 is also possible. With such a configuration, in the liquid crystal display device 90, it is possible to allow a delay state of a data signal in the second region AA2 to be close to a delay state of a data signal in the first region AA1.

Modified Example

Figure 18:
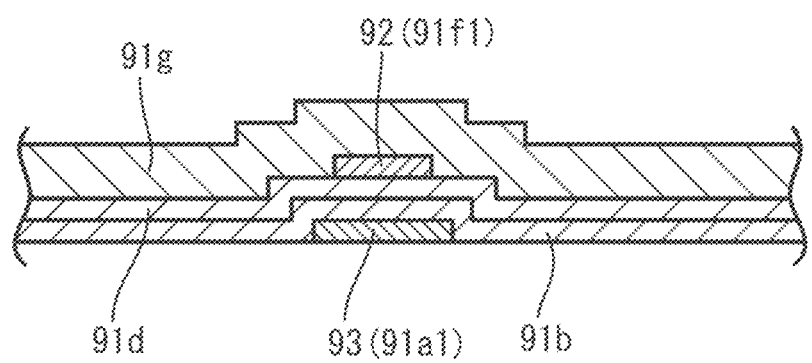
FIG. 18 is a cross-sectional view of a first source line and a second source line included in a liquid crystal display device according to a modified example of the third embodiment in a first region.

In the liquid crystal display device 90 according to the third embodiment described above, the first metal film 91a and the third metal film 91f are formed so as to extend parallel to each other in the Y-axis direction between pixel electrodes 31 adjacent to each other in the X-axis direction. Further, although FIG. 17 illustrates a case where widths (a dimension in the X-axis direction) of the first metal film 91a and the third metal film 91f are the same as each other, the widths of the first metal film 91a and the third metal film 91f may be different from each other. For example, as illustrated in FIG. 18, a width of a portion of the second source line 93 that is a portion of the first metal film 91a positioned below in the first region AA1 and a width of the provisional source line 94 can be larger than widths of portions of the first source line 92 and the second source line 93 that are portions of the third metal film 91f positioned above in the second region AA2. With such a configuration, since there is only the first metal film 91a positioned below, when viewed from the back side, it is possible to suppress scattering of light incident from the backlight device 12 of the back side.

Figure 19:
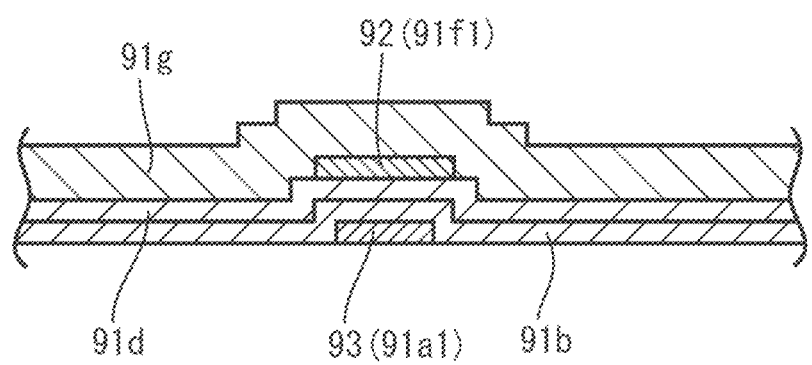
FIG. 19 is a cross-sectional view of a first source line and a second source line included in a liquid crystal display device according to another modified example of the third embodiment in the first region.

Meanwhile, as illustrated in FIG. 19, widths of the portions of the first source line 92 and the second source line 93 that are portions of the third metal film 91f positioned above in the second region AA2 can be larger than widths of the portion of the second source line 93 that is a portion of the first metal film 91a positioned below in the first region AA1, and the provisional source line 94. With such a configuration, since there is only the third metal film 91f positioned above, when viewed from the front side, it is possible to suppress scattering of light incident from the display region AA of the front side.

Fourth Embodiment

Figure 20:
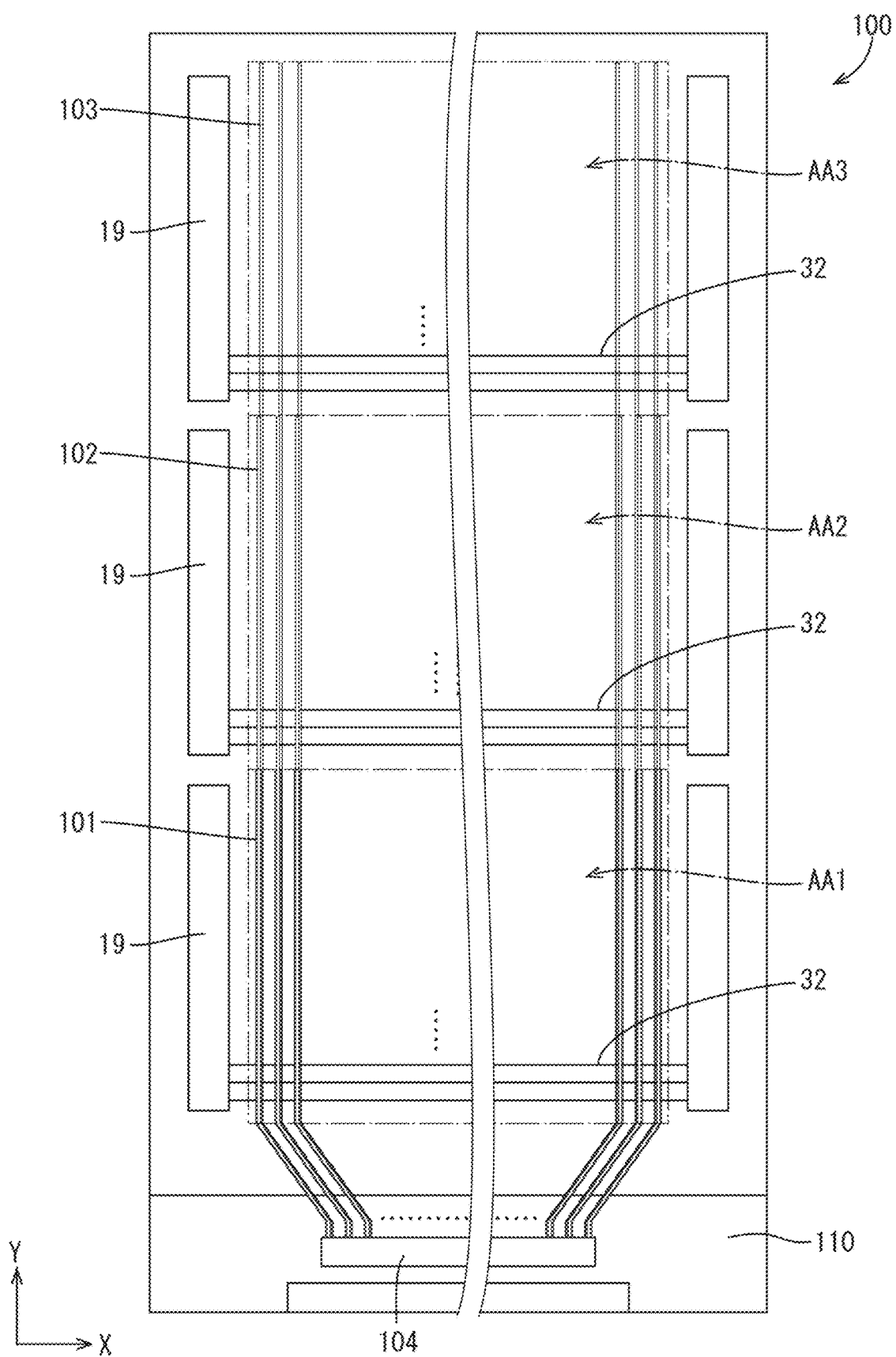
FIG. 20 is a plan view of a liquid crystal panel included in the liquid crystal display device according to a fourth embodiment.

A liquid crystal display device 100 which is a display device according to a fourth embodiment will be described with reference to FIGS. 20 and 21. In the liquid crystal display device 100 according to the fourth embodiment, a display region AA is divided into three regions and a third region AA3 is provided on the upper side of a second region AA2 in the Y-axis direction as illustrated in FIG. 20. Further, the liquid crystal display device 100 includes a third source line 103 for supplying a data signal to pixel electrodes 31 in the third region AA3, in addition to a first source line 101 for supplying a data signal to pixel electrodes 31 in a first region AA1, and a second source line 102 for supplying a data signal to pixel electrodes 31 in the second region AA2, and the three source lines 101, 102, and 103 are disposed so as to extend in the Y-axis direction between the pixel electrodes 31 adjacent to each other in the X-axis direction. Further, in the liquid crystal display device 100, all of the three source lines 101, 102, and 103 are led out from a lower side of the first region AA1 to be connected to a single source driver 104, and the three source lines including the first source line 101, the second source line 102, and the third source line 103 are disposed so as to overlap with one another in the first region AA1, and the second source line 102 and the third source line 103 are disposed so as to overlap with each other in the second region AA2.

Figure 21:
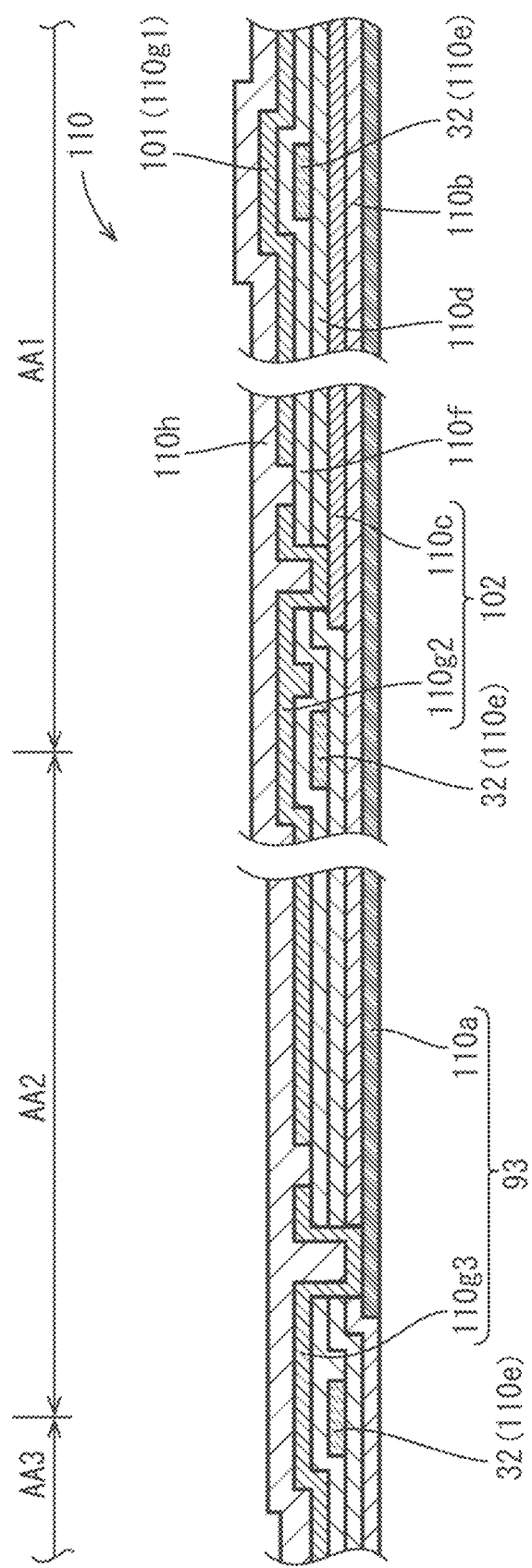
FIG. 21 is a side cross-sectional view of an array substrate along a Y-axis direction in FIG. 20.

Specifically, in an array substrate 110 included in the liquid crystal display device 100, a first metal film (first source metal) 110a, a first source insulating film 110b, a second metal film (second source metal) 110c, a second source insulating film 110d, a third metal film (gate metal) 110e, a gate insulating film 110f, a semiconductor film, a fourth metal film (third source metal) 110g, a first interlayer insulating film 110h, a planarizing film, a first transparent electrode film, a second interlayer insulating film, a second transparent electrode film, and an alignment film are stacked in this order from below (a side close to the glass substrate GS) of the array substrate 110 on the glass substrate GS as illustrated in FIG. 21. Note that a portion above the planarizing film is omitted in FIG. 21.

The fourth metal film 110g extends in the Y-axis direction between pixel electrodes 31 adjacent to each other in the X-axis direction and is cut into three portions, in which a portion 110g1 for the first region AA1 functions as part of the first source line 101, a portion 110g2 for the second region AA2 functions as part of the second source line 102, and a portion 110g3 for the third region AA3 functions as part of the third source line 103. That is, in the liquid crystal display device 100, a portion of the first source line 101 extending in the first region AA1, a portion of the second source line 102 extending in the second region AA2, and a portion of the third source line 103 extending in the third region AA3 are portions of the same metal film, that is, the fourth metal film 110g, so that it is possible to suppress occurrence of an error of data signal transmission from the source lines to the pixel electrodes.

Further, the second metal film 110c extends up to a portion near a boundary between the first region AA1 and the second region AA2, functions as a connection metal film, and is connected to the portion 110g2 of the fourth metal film. With such a configuration, the second source line 102 is a portion of the second metal film 110c and the portion 110g2 of the fourth metal film. Further, the first metal film 110a extends up to a portion near a boundary between the second region AA2 and the third region AA3, functions as a connection metal film, and is connected to the portion 110g3 of the fourth metal film. With such a configuration, the third source line 103 is a portion of the first metal film 110a and the portion 110g3 of the fourth metal film.

Figure 22:
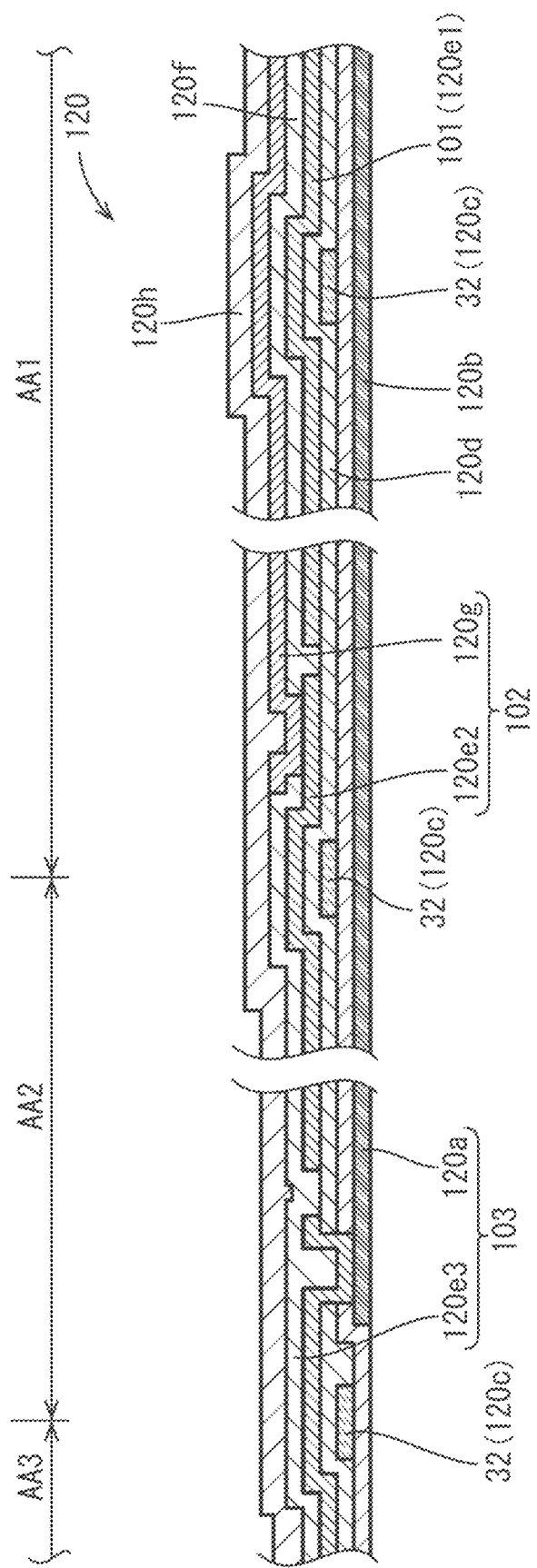
FIG. 22 is a side cross-sectional view of an array substrate included in a liquid crystal display device according to a modified example of the fourth embodiment along a Y-axis direction.

Note that a structure of the array substrate 110 illustrated in FIG. 21 is only an example, and an array substrate 120 having a structure illustrated in FIG. 22 can also be adopted. In plane terms, the array substrate 120 has a structure corresponding to a combination of the structure of the array substrate 20B according to the first embodiment and the structure of the array substrate 81 according to the second embodiment. Specifically, in an array substrate 120, a first metal film (first source metal) 120a, a first source insulating film 120b, a second metal film (gate metal) 120c, a gate insulating film 120d, a semiconductor film, a third metal film (second source metal) 120e, a second source insulating film 120f, a fourth metal film (third source metal) 120g, a first interlayer insulating film 120h, a planarizing film, a first transparent electrode film, a second interlayer insulating film, a second transparent electrode film, and an alignment film are stacked in this order from below (a side close to the glass substrate GS) of the array substrate 120 on the glass substrate GS. Note that a portion above the planarizing film is omitted in FIG. 22.

The third metal film 120e extends in the Y-axis direction between pixel electrodes 31 adjacent to each other in the X-axis direction and is cut into three portions, in which a portion 120e1 for the first region AA1 functions as part of the first source line 101, a portion 120e2 for the second region AA2 functions as part of the second source line 102, and a portion 120e3 for the third region AA3 functions as part of the third source line 103. That is, the third metal film 120e functions as a main metal film. Further, the fourth metal film 120g extends up to a portion near the boundary between the first region AA1 and the second region AA2, functions as a connection metal film, and is connected to the portion 120e2 of the third metal film. With such a configuration, the second source line 102 is the portion 120e2 of the third metal film and a portion of the fourth metal film. Further, the first metal film 120a extends up to a portion near a boundary between the second region AA2 and the third region AA3, functions as a connection metal film, and is connected to the portion 120e3 of the third metal film. With such a configuration, the third source line 103 is a portion of the first metal film 120a and the portion 120e3 of the third metal film. Note that the array substrates 110 and 120 each may include a provisional data line like the array substrate 91 according to the third embodiment.

Since the pixel electrodes 31 in the three regions AA1, AA2, and AA3 can be independently driven by the single source driver 104 in the liquid crystal display device 100 according to the third embodiment configured as described above, it is possible to implement a narrower frame width or a higher definition, and to further secure a charge time for each pixel or a higher refresh rate, in comparison to the liquid crystal display devices 10, 80, and 90 according to the three embodiments described above.

Further, a case where all the display devices according to the embodiments are liquid crystal display devices has been described, but the present technology can also be adopted for an organic electroluminescent (EL) display device.

The invention claimed is:

1. A display device comprising:
    a substrate including
        pixel electrodes arranged in a matrix form in a first direction and a second direction intersecting with each other;
        a first data line extending in the first direction and through which a data signal is supplied to the pixel electrodes disposed in a first region among the pixel electrodes, and the first region being a region close to one ends of the pixel electrodes in the first direction; and
        a second data line extending in the first direction and through which a data signal is supplied to the pixel electrodes disposed in a second region among the pixel electrodes, and the second region being a region closer to another ends of the pixel electrodes in the first direction than the first region is; and
    a driver circuit disposed close to the one ends of the pixel electrodes in the first direction and configured to supply a data signal to each of the pixel electrodes through the first data line and the second data line,
    wherein the first data line and the second data line are disposed so as to overlap with each other in the first region.

2. The display device according to claim 1, wherein
    the first data line has a portion extending in the first region and the second data line has a portion extending in the second region, the portions are portions of a same metal film that is a main metal film, and the second data line has a portion extending in the first region and the portion is a portion of a connection metal film different from the main metal film,
    the second data line is formed by connecting the portion of the connection metal film and the portion of the main metal film to each other, and
    the main metal film and the connection metal film are stacked in the first region such that the first data line and the second data line overlap with each other in the first region.

3. The display device according to claim 2, wherein
    the substrate includes a scanning line that is a portion of a scanning line metal film different from the main metal film and the connection metal film, and the scanning line extends in the second direction and a scanning signal is supplied through the scanning line, and the connection metal film is disposed in a layer lower than the scanning line metal film and the main metal film is disposed in a layer upper than the scanning line metal film so that the first data line is disposed in a layer upper than the second data line in the first region.

4. The display device according to claim 2, wherein the substrate includes a scanning line that is a portion of a scanning line metal film different from the main metal film and the connection metal film, and the scanning line extends in the second direction and a scanning signal is supplied through the scanning line, and the main metal film is disposed in a layer upper than the scanning line metal film and the connection metal film is disposed in a layer upper than the main metal film so that the second data line is disposed in a layer upper than the first data line in the first region.

5. The display device according to claim 2, wherein the substrate includes a provisional data line that is a portion of the connection metal film and disposed so as to overlap with the second data line in the second region.

6. The display device according to claim 5, wherein the provisional data line is configured to receive a signal.

7. The display device according to claim 5, wherein a data line that is a portion of one of the main metal film and the connection metal film disposed in a layer upper than another one has a width larger than a data line that is disposed in a lower layer.

8. The display device according to claim 5, wherein a data line that is a portion of one of the main metal film and the connection metal film disposed in a layer lower than another one has a width larger than a data line that is disposed in an upper layer.

9. The display device according to claim 1, wherein the driver circuit is configured to input signals having a same polarity to the first data line and the second data line, respectively.

10. The display device according to claim 1, wherein the substrate includes a third data line through which a data signal is supplied to the pixel electrodes disposed in a third region among the pixel electrodes, the third region is a region closer to the other ends of the pixel electrodes in the first direction than the second region is, and the first data line, the second data line, and the third data line are disposed so as to overlap with one another in the first region, and the second data line and the third data line are disposed so as to overlap with each other in the second region.

* * * * *